United States Patent [19]
Arase

[11] Patent Number: 5,969,990
[45] Date of Patent: Oct. 19, 1999

[54] NONVOLATILE MEMORY ARRAY WITH NAND STRING MEMORY CELL GROUPS SELECTIVELY CONNECTED TO SUB BIT LINES

[75] Inventor: Kenshiro Arase, Kanagawa, Japan

[73] Assignee: Sony Corporation, Tokyo, Japan

[21] Appl. No.: 09/015,787

[22] Filed: Jan. 29, 1998

[30] Foreign Application Priority Data

Jan. 31, 1997 [JP] Japan ................................ P09-018566

[51] Int. Cl.[6] .................................................. G11C 16/06
[52] U.S. Cl. ................................ 365/185.25; 365/185.17; 365/185.26
[58] Field of Search .......................... 365/185.25, 185.17, 365/185.26

[56] References Cited

U.S. PATENT DOCUMENTS 5,524,094  6/1996  Nobukata et al. .................. 365/185.27
5,690,347  11/1997  Takeuchi et al. ................... 365/185.17
5,715,194  2/1998  Hu ........................................ 365/185.17
5,745,413  4/1998  Iwahashi ............................. 365/185.17

*Primary Examiner*—David Nelms
*Assistant Examiner*—Hoai V. Ho
*Attorney, Agent, or Firm*—Ronald P. Kananen; Rader, Fishman & Grauer

[57] ABSTRACT

A semiconductor nonvolatile memory device where a main bit line is divided into a plurality of sub bit lines via operational connecting means, memory transistors connected to the sub bit lines are arranged in the form of a matrix, and control gate electrodes of these memory transistors are connected to word lines, provided with a means for setting sub bit lines at a programming prohibit potential at the time of a data programming operation; a means for causing a discharge in a selected sub bit line among the sub bit lines set to the programming prohibit potential and placing the non-selected sub bit lines among the sub bit lines in a floating state; and a means for supplying a program voltage to the selected word line.

19 Claims, 33 Drawing Sheets

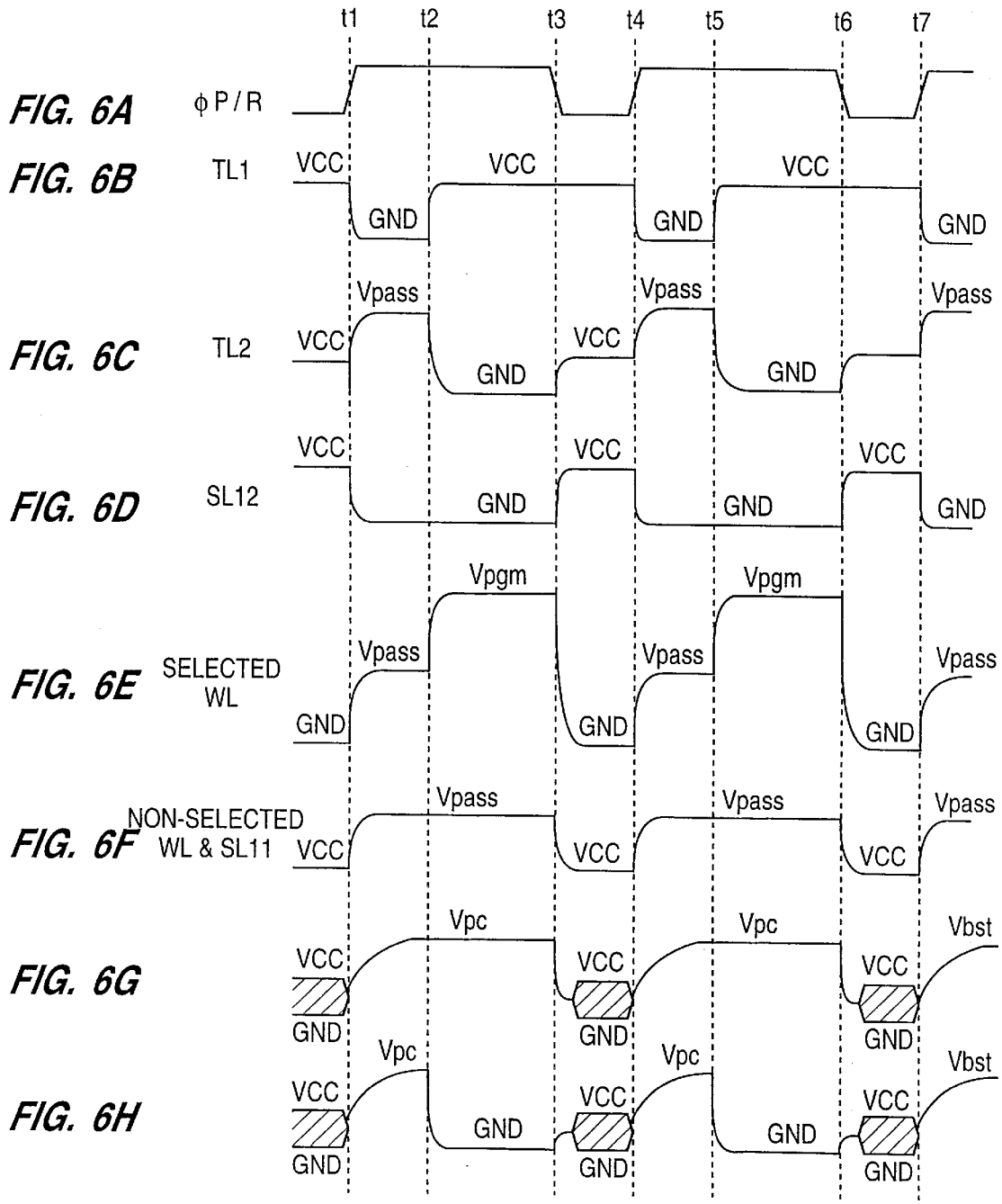

FIG. 7

| OPERATION | | PROGRAM (AT PRECHARGE) | PROGRAM (AT REAL PROGRAMMING) | ERASING | READING |
|---|---|---|---|---|---|
| COMMON PORTION | MBLa | VCC (3.3V) NON-SELECTED | VCC (3.3V) NON-SELECTED | FLOATING | 1/2 VCC PRECHARGE |
| | MBLb | GND (0V) SELECTED | GND (0V) SELECTED | FLOATING | 1/2 VCC PRECHARGE |
| | VSS | GND (0V) | GND (0V) | Verase (22V) | GND (0V) |
| | P WELL | GND (0V) | GND (0V) | Verase (22V) | GND (0V) |
| | TL1 | GND (0V) | VCC (3.3V) | Verase (22V) | VCC (3.3V) |
| | TL2 | Vpass (9V) | GND (0V) | Verase (22V) | GND (0V) |
| | PCL | Vpc(9V) | Vpc(9V) | FLOATING | FLOATING |
| SELECTED BLOCK | SL11 | GND (0V) | VCC (3.3V) | Verase (22V) | VCC (3.3V) |
| | WL11 | Vpass (9V) NON-SELECTED | Vpass (9V) NON-SELECTED | GND (0V) | VCC (3.3V) NON-SELECTED |
| | WL12 | Vpass (9V) SELECTED | Vpgm (18V) SELECTED | GND (0V) | GND (0V) SELECTED |
| | WL13 | Vpass (9V) NON-SELECTED | Vpass (9V) NON-SELECTED | GND (0V) | VCC (3.3V) NON-SELECTED |
| | WL14 | Vpass (9V) NON-SELECTED | Vpass (9V) NON-SELECTED | GND (0V) | VCC (3.3V) NON-SELECTED |
| | SL12 | GND (0V) | GND (0V) | Verase (22V) | VCC (3.3V) |
| NON-SELECTED BLOCK | SL21 | GND (0V) | GND (0V) | Verase (22V) | GND (0V) |
| | WL21 | GND (0V) | GND (0V) | Verase (22V) | GND (0V) |
| | WL22 | GND (0V) | GND (0V) | Verase (22V) | GND (0V) |
| | WL23 | GND (0V) | GND (0V) | Verase (22V) | GND (0V) |
| | WL24 | GND (0V) | GND (0V) | Verase (22V) | GND (0V) |
| | SL22 | GND (0V) | GND (0V) | Verase (22V) | GND (0V) |

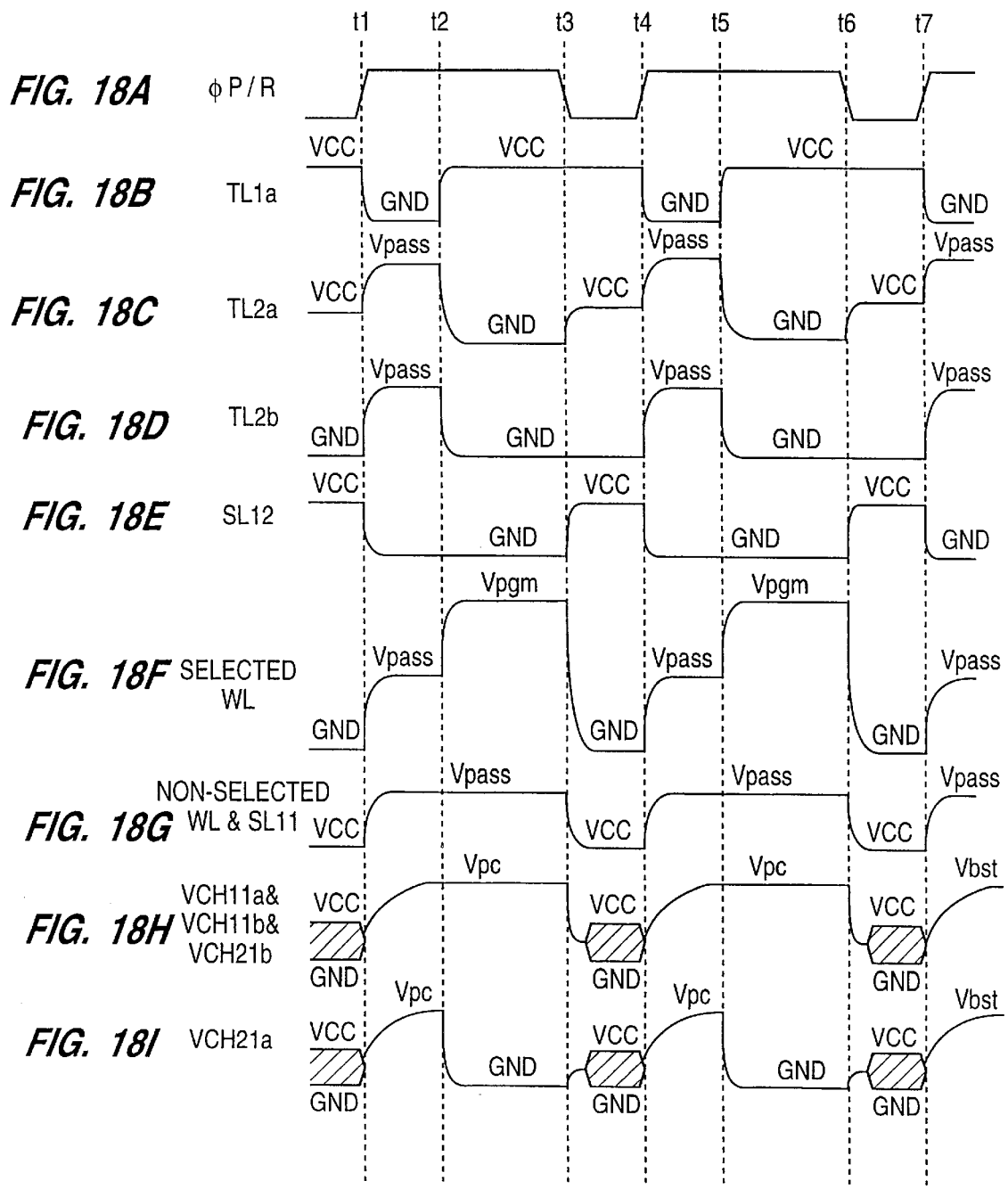

FIG. 19

| OPERATION | | PROGRAM (AT PRECHARGE) | PROGRAM (AT REAL PROGRAMMING) | ERASING | READING |
|---|---|---|---|---|---|
| COMMON PORTION | MBL1 | VCC (3.3V) NON-SELECTED | VCC (3.3V) NON-SELECTED | FLOATING | 1/2 VCC PRECHARGE |
| | MBL2 | GND (0V) SELECTED | GND (0V) SELECTED | FLOATING | 1/2 VCC PRECHARGE |
| | VSS | GND (0V) | GND (0V) | Verase (22V) | GND (0V) |
| | P WELL | GND (0V) | GND (0V) | Verase (22V) | GND (0V) |
| | TL1a | GND (0V) SELECTED | VCC (3.3V) SELECTED | Verase (22V) | VCC (3.3V) (SELECTED) |
| | TL1b | GND (0V) NON-SELECTED | GND (0V) NON-SELECTED | Verase (22V) | GND (0V) (NON-SELECTED) |
| | TL2a | Vpass (9V) SELECTED | GND (0V) SELECTED | Verase (22V) | VCC (3.3V) SELECTED |
| | TL2b | Vpass (9V) NON-SELECTED | GND (0V) NON-SELECTED | Verase (22V) | GND (0V) NON-SELECTED |
| | PCL | Vpc(9V) | Vpc(9V) | FLOATING | FLOATING |
| SELECTED BLOCK | SL11 | GND (0V) | VCC (3.3V) | Verase (22V) | VCC (3.3V) |
| | WL11 | Vpass (9V) NON-SELECTED | GND (0V) NON-SELECTED | GND (0V) | VCC (3.3V) NON-SELECTED |
| | WL12 | Vpass (9V) SELECTED | Vpass (18V) SELECTED | GND (0V) | GND (0V) SELECTED |
| | WL13 | Vpass (9V) NON-SELECTED | GND (0V) NON-SELECTED | GND (0V) | VCC (3.3V) NON-SELECTED |
| | WL14 | Vpass (9V) NON-SELECTED | GND (0V) NON-SELECTED | GND (0V) | VCC (3.3V) NON-SELECTED |
| | SL12 | GND (0V) | GND (0V) | Verase (22V) | VCC (3.3V) |
| NON-SELECTED BLOCK | SL21 | GND (0V) | GND (0V) | Verase (22V) | GND (0V) |
| | WL21 | GND (0V) | GND (0V) | Verase (22V) | GND (0V) |
| | WL22 | GND (0V) | GND (0V) | Verase (22V) | GND (0V) |
| | WL23 | GND (0V) | GND (0V) | Verase (22V) | GND (0V) |
| | WL24 | GND (0V) | GND (0V) | Verase (22V) | GND (0V) |
| | SL22 | GND (0V) | GND (0V) | Verase (22V) | GND (0V) |

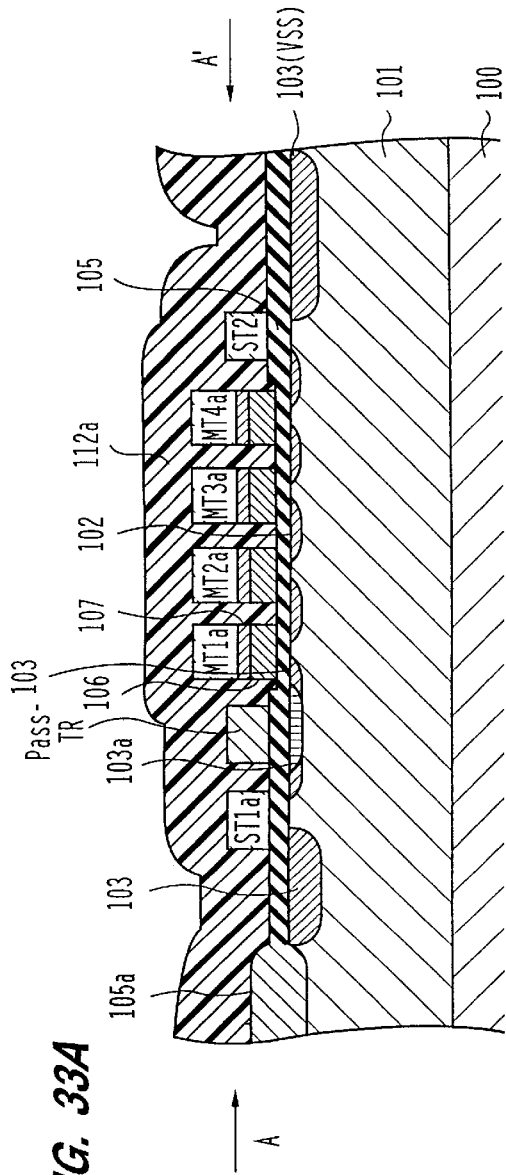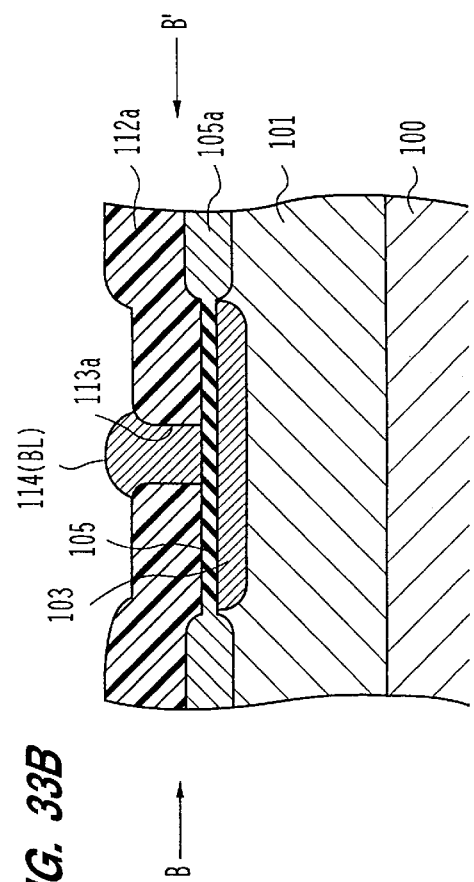

NONVOLATILE MEMORY ARRAY WITH NAND STRING MEMORY CELL GROUPS SELECTIVELY CONNECTED TO SUB BIT LINES

BACKGROUND OF THE INVENTION

1. Field of the Invention

The present invention relates to a semiconductor nonvolatile memory device such as a NAND type flash memory suitable for operation by a single power supply at a low voltage and a method of data programming of the same.

2. Description of the Related Art

Conventionally, in semiconductor nonvolatile memory devices such as EPROM's or flash memories, the mainstream was a NOR type semiconductor nonvolatile memory device for performing the programming of data by injecting electrons into a floating gate by injection of channel hot electrons (hereinafter referred to as "CHE's").

In a NOR type semiconductor nonvolatile memory device, however, two memory transistors share one bit contact and source line, therefore there is a problem in that higher integration is difficult and an increase of capacity cannot be achieved.

From the above viewpoint, a NAND type flash memory realizing higher integration by connecting a plurality of memory transistors in series to constitute a NAND string and having two NAND strings share one bit contact and source line has been proposed.

In a general NAND type flash memory, in an erasing operation, 0 V is supplied to all word lines of a selected NAND string block, and a high voltage (for example 20 V) is supplied to all word lines of non-selected NAND string blocks and a substrate of a memory array.

As a result, electrons are pulled out of the floating gates of only the memory transistors of the selected NAND string block to the substrate. The threshold voltage of the memory transistors shifts in a negative direction and becomes for example about −3 V.

On the other hand, the operation for programming data is carried out together for memory transistors connected to the selected word lines in so-called page units. A high voltage (for example, 18 V) is supplied to the selected word lines, 0 V is supplied to the bit lines to which the ("1" data) memory transistors which are to be programmed are connected, and an intermediate voltage (for example, 9 V) is supplied to the bit lines to which the ("0" data) memory transistors which are prohibited from being programmed are connected.

As a result, electrons are injected into the floating gates of only the selected memory transistors which are to be programmed. The threshold voltage of the selected memory transistors shifts in a positive direction and becomes for example about 2 V.

In such a NAND type flash memory, both the programming and erasing of the data are carried out by an FN (Fowler-Nordheim) tunnel current. Therefore, there are the advantages that it is relatively easy to supply an operating current from a booster circuit inside the chip and that operation by a single power source is easy.

Further, since the data is programmed in units of pages, that is, all together for memory transistors connected to the selected word line, as a natural result, this memory is superior in the point of the programming speed.

Nevertheless, the above NAND type flash memory has the following disadvantage.

Namely, since the data programming operation of the NAND type flash memory is carried out in units of pages, it is necessary to supply an intermediate voltage (for example 9 V) to all bit lines to which memory transistors for which programming is prohibited are connected.

The number of bit lines in a page unit usually is as much as that for 512 bytes, that is, about 4000, therefore the load an the booster circuit for generating the intermediate voltage is large.

Further, in the above data programming operation, due to the necessity of controlling the threshold voltage of the programmed memory transistors, the programming/verifying operation is repeatedly carried out a number of times, therefore it is necessary to charge the bit lines for which programming is prohibited to the intermediate voltage at every programming operation.

For this reason, when the programming/verifying operation has been performed a large number of times, the time required for switching of the bit line voltage in the programming/verifying operation becomes greater than the substantive programming time. The programming speed is therefore restricted and high speed programming becomes difficult.

Further, the data latch circuits provided for every bit line for latching the page data must be made so durable against high voltages in specifications so as to handle the intermediate voltage. The size inevitably becomes large, and accordingly it becomes difficult to lay out the data latch circuits for every bit line.

A new method of programming of a NAND type flash memory which solves the above problems, which is suited for operation by a single power supply at a low voltage, which is able to be processed at a high speed, and in addition which enables easy layout of the data latch circuits for the bit lines is disclosed from p. 1152 to p. 1153 and FIG. 5 to FIG. 6 of the "IEEE Journal of Solid-State Circuits", vol. 30, No. 11, November 1995.

In the data programming operation disclosed in the above document, NAND strings to which memory transistors for which programming is prohibited are placed in a floating state and the channel portion voltage of the NAND strings is automatically boosted mainly by capacity-coupling with a pass voltage(for example, 10 V) supplied to the non-selected word lines.

This automatic boosting operation is referred to as a "self-boost" operation.

FIG. 28 is a view explaining an operation where the data programming of a NAND type flash memory is carried out by a self-boost operation.

The NAND type flash memory of FIG. 28 is for convenience shown as a memory array where four memory transistors are connected in series to one NAND string connected to two bit lines, but in an actual memory array, the number of the memory transistors connected in series to one NAND string is generally as high as 16.

In FIG. 28, BL$a$ and BL$b$ denote bit lines. The bit line BL$a$ has connected to it a NAND string comprised of two selection transistors ST1$a$ and ST2$a$ and four memory transistors MT1$a$ to MT4$a$ connected in series.

Further, the bit line BL$b$ has connected to it a NAND string comprised of two selection transistors ST1$b$ and ST2$b$ and four memory transistors MT1$b$ to MT4$b$ connected in series.

The selection transistors ST1$a$ and ST1$b$ are controlled by a selection gate line SL1, while the selection transistor ST2$a$ and ST2$b$ are controlled by a selection gate line SL2. Further, the memory transistors MT1$a$ to MT4$a$ and MT1$b$ to MT4$b$ are controlled by word lines WL1 to WL4, respectively.

Next, an explanation will be made of an operation where MT2$a$ is a memory transistor for which programming is prohibited and MT2$b$ is a memory transistor which is to be programmed when the word line WL2 is selected and page programming is carried out in the NAND type flash memory of FIG. 28.

First, a power supply voltage VCC (3.3 V) is supplied to the selection gate line SL1, a ground voltage GND (0 V) is supplied to the selection gate line SL2, the power supply voltage VCC (3.3 V) is supplied to the bit line BL$a$ to which the memory transistor MT2$a$ for which programming is prohibited is connected, and the ground voltage GND (0 V) is supplied to the bit line BL$b$ to which the memory transistor MT2$b$ which is to be programmed is connected.

Next, a program voltage Vpgm (for example, 18 V) is supplied to the selection word line WL2, and the pass voltage Vpass (for example, 10 V) is supplied to the non-selected word lines WL1 and WL3 to WL4.

As a result, the channel portion of the NAND string to which the memory transistor MT2$a$ for which programming is prohibited is connected achieves a floating state, the potential of the channel portion is mainly boosted by capacitor-coupling with the pass voltage Vpass supplied to the non-selected word lines ( three in FIG. 28, but generally 15) and rises up to the programming prohibit voltage, and data programming to the memory transistor MT2$a$ is prohibited.

On the other hand, the channel portion of the NAND string to which the memory transistor MT1$b$ which is to be programmed is set to the ground voltage GND (0 V), data is programmed to the memory transistor MT2$b$ by the potential difference with the program voltage Vpgm supplied to the selected word line, and the threshold voltage shifts in the positive direction and becomes for example −3 V to about 2 V of the erasing state.

FIGS. 29A and 29B are views explaining the self-boost operation. FIG. 29A illustrates one memory transistor in the program prohibit NAND string at the time of a self-boost operation; and FIG. 29B is an equivalent circuit diagram thereof.

In FIG. 29A, VC is a voltage supplied to the word line WL (control gate CG), VF is a potential of the floating gate FG, Vch is a boosted NAND string channel potential, C-ono is an inter-layer capacitor comprised by a three-layer insulation film between a control gate and a floating gate, C-tox is a tunnel oxide film capacity, and C-ch is a channel portion capacitor of a memory transistor including a source/drain diffusion layer region. Further, L-dep is the length of spread of a depletion layer in the source/drain diffusion layer.

Further, in FIG. 29B, C-ins is a combined capacitor comprised by a serial connection of the inter-layer capacitor C-ono and the tunnel oxide film capacitor C-tox.

By the equivalent circuit of FIG. 29B, the NAND string channel potential Vch at the time of a self-boost operation is represented by equation (1):

$$Vch=Vr*VC \quad (1)$$

Here, Br is a self-boost efficiency represented by the following equation (2) and usually is set at around 0.8 according to the optimum design of the device structure.

$$Br=C\text{-}ins/(C\text{-}ins+C\text{-}ch) \quad (2)$$

In the self-boost operation at the time of programming, VC of equation (1) becomes the weighted average of all voltages supplied to the word lines, but in a general NAND type flash memory, there are about 16 word lines constituting a NAND string, therefore the pass voltage supplied to the non-selected word lines becomes greater.

Accordingly, equation (1) may be represented as in equation (3).

$$Vch=Br*Vpass \quad (3)$$

Accordingly, if Br=0.8 and Vpass=10 V, Vch becomes almost equal to 8 V and can sufficiently become the programming prohibit voltage.

The data programming operation of the NAND type flash memory using the above self-boost operation is suited to operation by a single power supply at a low voltage since it is not necessary to supply a high intermediate voltage to the non-selected bit lines, it enables high speed programming, and in addition enables easy layout of the data latch circuits for every bit line.

However, in order to realize a self-boost operation, it is necessary to make the self-boost efficiency Br large, i.e., 0.6 to 0.8 at the lowest.

When the self-boost efficiency Br cannot be sufficiently obtained, the NAND string channel potential Vch does not sufficiently rise, therefore, in the example of FIG. 28, there is a possibility that the non-selected memory transistor MT2$a$ will be erroneously programmed.

Further, when it is intended to increase the channel potential Vch by raising the pass voltage Vpass, in the example of FIG. 28, there is a possibility that the memory transistors MT1$b$ and MT3$b$ to MT4$b$ will be erroneously programmed.

Further, the self-boost efficiency Br cannot become about 1 in principle, therefore even in a case where the non-selected memory transistors are not erroneously programmed, degradation of the disturb tolerance cannot be avoided.

In the device structure of a NAND type flash memory, in order to set the self-boost efficiency Br as large as possible for avoiding the above problem, it is necessary to make the channel portion capacitor C-ch of a memory transistor including a source/drain diffusion layer region smaller than that of equation (2). The P-type impurity concentration of the P-type well region in which the NAND type memory array is formed must be set low for this purpose.

If the P-type impurity concentration is set low as described above, however, the length of spread of the depletion layer L-dep illustrated in FIG. 29A becomes large, the punch through tolerance is lowered, the channels of the memory transistors and selection transistors can no longer be shortened, and consequently higher integration can no longer be realized.

That is, in the device structure of the NAND type flash memory of the related art, there is a tradeoff between securing the self-boost efficiency Br and shortening the channels of the memory transistors and the selection transistors, therefore it is difficult to both secure a disturb tolerance and a higher integration.

FIGS. 30A and 30B are graphs showing the tradeoff explained above.

In FIG. 30A, the abscissa indicates the concentration Ndope of the memory array PWELL, while the ordinate indicates the self-boost efficiency Br.

Further, in FIG. 30B, the abscissa indicates the concentration Ndope of the memory array PWELL, while the ordinate indicates the channel shortening limit Lmin of the memory transistors and selection transistor (TR).

It is understood from FIG. 30A that, in order to secure a sufficient self-boost efficiency Br, it is necessary to set the PWELL concentration Ndope low. On the other hand, it is understood from FIG. 30B that shortening of the channels of the memory transistors and selection transistors becomes difficult if the PWELL concentration Ndope is set low.

In the NAND type flash memory of the related art, aluminum is used for each of the bit lines arranged in the column direction.

In this case, due to the restriction of the pitch in the column direction, it becomes difficult to arrange bit contacts between the aluminum interconnections, diffusion layer and the data latch circuits for every bit line.

A structure of a NAND type flash memory which solves the above problems, eases the restriction of the pitch in the column direction, and eases the arrangement of the bit contacts between the aluminum interconnections and the diffusion layer and the data latch circuits for every bit line is disclosed in the diagram of the memory array of FIG. 2 and the diagram of the pattern layout of FIG. 3 in U.S. Pat. No. 4,962,481.

In the NAND type flash memory disclosed in the above patent, the restriction of the pitch in the column direction is eased by having a pair of two NAND strings share one bit line.

FIG. 31 is a view of the memory array of the NAND type flash memory disclosed in the above patent.

The NAND type flash memory of FIG. 31 is for convenience shown as a memory array comprised of a pair of two NAND strings connected to one bit line and four memory transistors connected in series to each NAND string, but in an actual memory array, there are generally about 16 memory transistors connected in series to one NAND string.

In FIG. 31, BL denotes a bit line. The bit line has connected to it a pair of two NAND strings NANDa and NANDb.

The NAND string NANDa is comprised of two selection transistors ST1a, ST2a, four memory transistors MT1a to MT4a, and a pass transistor Pass-TR connected in series.

The NAND string NANDb is comprised of two selection transistors ST1b, ST2b, four memory transistors MT1b to MT4b, and a pass transistor Pass-TR connected in series.

The selection transistors ST1a and ST1b are respectively controlled by selection gate lines SL1a and SL1b, the selection transistors ST2a and ST2b are controlled by the selection gate line SL2, and the memory transistors MT1a to MT4a and MT1b to MT4b are respectively controlled by the word lines WL1 to WL4.

Here, the pass transistor Pass-TR of the NAND string NANDa is controlled by the selection gate line SL1b, while the pass transistor Pass-TR of the NAND string NANDb is controlled by the selection gate line SL1a. In these pass transistors pass-TR, N-type impurity layers such as phosphorus (P) are formed. The transistors are in the ON state irrespective of the voltage supplied to the selection gate lines.

Accordingly, in the memory array of FIG. 31, when the selection gate line SL1a is at a high level, and the selection gate line SL1b is at a low level, the NAND string NANDa is connected to the bit line BL. When the selection gate line SL1b is at a high level, and the selection gate line SL1a is at a low level, the NAND string NANDb is connected to the bit line BL.

FIG. 32 is a view of the pattern layout of the NAND type flash memory of FIG. 31.

Further, FIGS. 33A and 33B are sectional views of the device structure of the pattern layout of FIG. 32, in which FIG. 33A is a sectional view in the direction A-A'; and FIG. 33B is a sectional view in the direction B-B'.

In FIG. 32 and FIGS. 33A and 33B, 100 denotes a semiconductor substrate, 101 a P-type well region in which a memory array region is formed, 102 a source and drain N-type diffusion layer of a memory transistor, 103 a VSS interconnection and an N-type diffusion layer of a bit contact portion, 103a an N-type diffusion layer formed in the channel portion of the pass transistor, 104 a tunnel oxide film, 105 a gate oxide film of the selection transistor portion, 105a a LOCOS element isolation oxide film, 106 a first layer polycrystalline silicon gate electrode forming a floating gate electrode, 107 an ONO-3 layer insulation film, 108 second layer polycrystalline silicon interconnections forming control gate electrodes of the memory transistors and selection transistors, 112a an inter-layer insulation film under the aluminum interconnections, 113a a contact hole under the aluminum interconnections, and 114 aluminum interconnections.

In the memory array of the NAND type flash memory mentioned above, the pitch of the bit line layout in the column direction is increased to two times the usual pitch, therefore the layout of the bit contacts between the aluminum interconnections and diffusion layer and data latch circuits for every bit line is easy.

However, in the memory array described above, it is necessary to connect one extra pass transistor in series for every NAND string, therefore there is a disadvantage that the memory size becomes larger by about 6 to 7 percent and the cost becomes high.

SUMMARY OF THE INVENTION

The present invention was made in consideration with such a circumstance and has as a first object to provide a semiconductor nonvolatile memory device suited for operation by a single power supply at a low voltage, enabling easy layout of the data latch circuits for every bit line, and in addition performing a data programming operation with a good disturb tolerance.

Further, a second object of the present invention is to provide a semiconductor nonvolatile memory device capable of easing the pitch of the bit line layout in the column direction without the size of the memory becoming substantially larger.

To attain the above objects, the present invention provides a semiconductor nonvolatile memory device where a main bit line is divided into a plurality of sub bit lines via operational connecting means, memory transistors connected to the sub bit lines are arranged in the form of a matrix, and control gate electrodes of these memory transistors are connected to word lines, provided with a means for setting sub bit lines at a programming prohibit potential at the time of a data programming operation; a means for causing a discharge in a selected sub bit line among the sub bit lines set to the programming prohibit potential and placing the non-selected sub bit lines among the sub bit lines in a floating state; and a means for supplying a program voltage to the selected word line.

Further, the present invention provides a NAND type semiconductor nonvolatile memory device where a main bit line is divided into a plurality of sub bit lines via an operational connecting means, memory transistors which are electrically programmed in data are connected in series between the sub bit lines and a ground line via selected transistors to constitute NAND strings, and the NAND strings are arranged in the form of a matrix, provided with a means for selecting a sub bit line where the selected NAND string is located and boosting the potential of the selected NAND string channel portion from the sub bit line to the programming prohibit potential at the time of a data programming operation; a means for discharging the programming prohibit potential charged in the NAND string channel portion and the sub bit line to which the NAND string is connected to the main bit line according to the data to be programmed; and a means for performing page programming together for memory transistors connected to the selected word line by supplying the programming voltage to the selected word line.

Further, the present invention provides a NAND type semiconductor nonvolatile memory device where a main bit line is divided into a pair of a first group of sub bit lines and a second group of sub bit lines arranged in the column direction via an operational connecting means, a plurality of memory transistors which are electrically programmed in data are connected in series between first sub bit lines constituting the first group of sub bit lines and second sub bit lines constituting the second group of sub bit lines and the ground line via selection transistors to constitute a first NAND string and a second NAND string, the first NAND column and second NAND column are arranged in the form of matrix, and control electrodes of the memory transistors of a same row are connected to a common word line, provided with a means for selecting a first sub bit line and a second sub bit line crossing a selected word line at the time of a data programming operation and boosting both of the potentials of the first NAND string and second NAND string crossing with the selected word line from the sub bit lines up to the programming prohibit potential; a means for discharging a programming prohibit potential charged in the selected NAND string channel portion and the sub bit line to which the NAND string is connected to the main bit line according to the data to be programmed while holding the programming prohibit potential charged in the non-selected NAND string channel portion among the first NAND string and second NAND string and the sub bit line to which the NAND string is connected in the floating state; and a means for performing page programming together for memory transistors connected to the selected word line of only the selected NAND string among the first NAND string and second NAND string by supplying the program voltage to the selected word line.

Further, the present invention provides a semiconductor nonvolatile memory device provided with a plurality of groups of sub bit lines comprised of main bit lines arranged in the form of columns divided in a plurality of column directions and a means for selecting any sub bit line from any group of sub bit lines among a plurality of groups of sub bit lines and connecting the same to the main bit line, a plurality of memory transistors which are electrically programmed in data are connected in series between the sub bit lines and a ground line via selection transistors to constitute NAND strings, and the NAND strings are arranged in the form of a matrix.

Further, the plurality of groups of sub bit lines are a pair of a first group of sub bit lines and a second group of sub bit lines divided in the column direction.

The semiconductor nonvolatile memory device of the present invention, for example, a NAND type semiconductor nonvolatile memory device, is configured as a memory array in which a main bit line is divided into sub bit lines. When the memory transistor is a memory transistor for which programming is prohibited, the potential of the NAND string channel portion is charged up to the programming prohibit potential via the sub bit line.

Accordingly, the charging capacity is greatly reduced in comparison with the system of the related art of charging the potential of the non-selected NAND string channel portion up to the programming prohibit potential via the main bit line so the memory is suited for low voltage operation. Further, the layout of the data latch circuits becomes easy.

Further, it is possible to set the programming prohibit potential to a sufficiently high voltage in comparison with the self-boost operation of raising the potential of the NAND string channel portion by capacity-coupling of the voltage supplied to the word lines.

For this reason, the disturb tolerance at the time of data programming can be improved.

Further, the NAND type semiconductor nonvolatile memory device of the present invention is configured as a memory array in which a main bit line is divided into a pair of a first group of sub bit lines and a second group of sub bit lines arranged in the column directions and page programming is selectively carried out from a selected sub bit line to the charged NAND string while holding the programming prohibit potential of the NAND string channel portion charged from the non-selected sub bit lines.

Accordingly, not only is it suited for low voltage operation by greatly reducing the charging capacitor in comparison with the system of the related art of charging the potential of the non-selected NAND string channel portion up to the programming prohibit potential via the main bit line, but also the layout of the bit contacts between the aluminum interconnections and the diffusion layer and the data latch circuits becomes easy since the pitch of main bit lines in the column direction can be further increased.

Further, it is possible to set the programming prohibit potential to a sufficiently high voltage in comparison with the self-boost operation of raising the potential of the NAND string channel portion by capacity-coupling of the voltage supplied to the word lines.

For this reason, the disturb tolerance at the time of data programming can be improved.

Further, the NAND type semiconductor nonvolatile memory device of the present invention is configured as a memory array in which a main bit line is divided into a plurality of groups of sub bit lines in a plurality of column directions. Accordingly, the pitch of the main bit lines in the column direction can be further increased, so the layout of the bit contacts between the aluminum interconnections and the diffusion layer and the data latch circuits becomes easy.

BRIEF DESCRIPTION OF THE DRAWINGS

These and other objects and features of the present invention will become clearer from the following description of the preferred embodiments given with reference to the attached drawings, in which:

FIGS. 6A through 6H, are timing charts for explaining the operation in FIG. 5;

FIG. 7 is a view of the setting of the biases for a programming operation, an erasing operation, and a reading operation in the NAND type semiconductor nonvolatile memory device of the first embodiment;

FIG. 18 consisting of FIGS. 18A through 18I is a timing chart for explaining the operation in FIG. 17;

FIG. 19 is a view of the setting of the biases for a programming operation, an erasing operation, and a reading operation in the NAND type semiconductor nonvolatile memory device of the third embodiment;

FIG. 33 consisting of FIGS. 33A through 33B is a sectional view of the device structure in the pattern layout of FIG. 32.

DESCRIPTION OF THE PREFERRED EMBODIMENTS

First Embodiment

Figure 1:
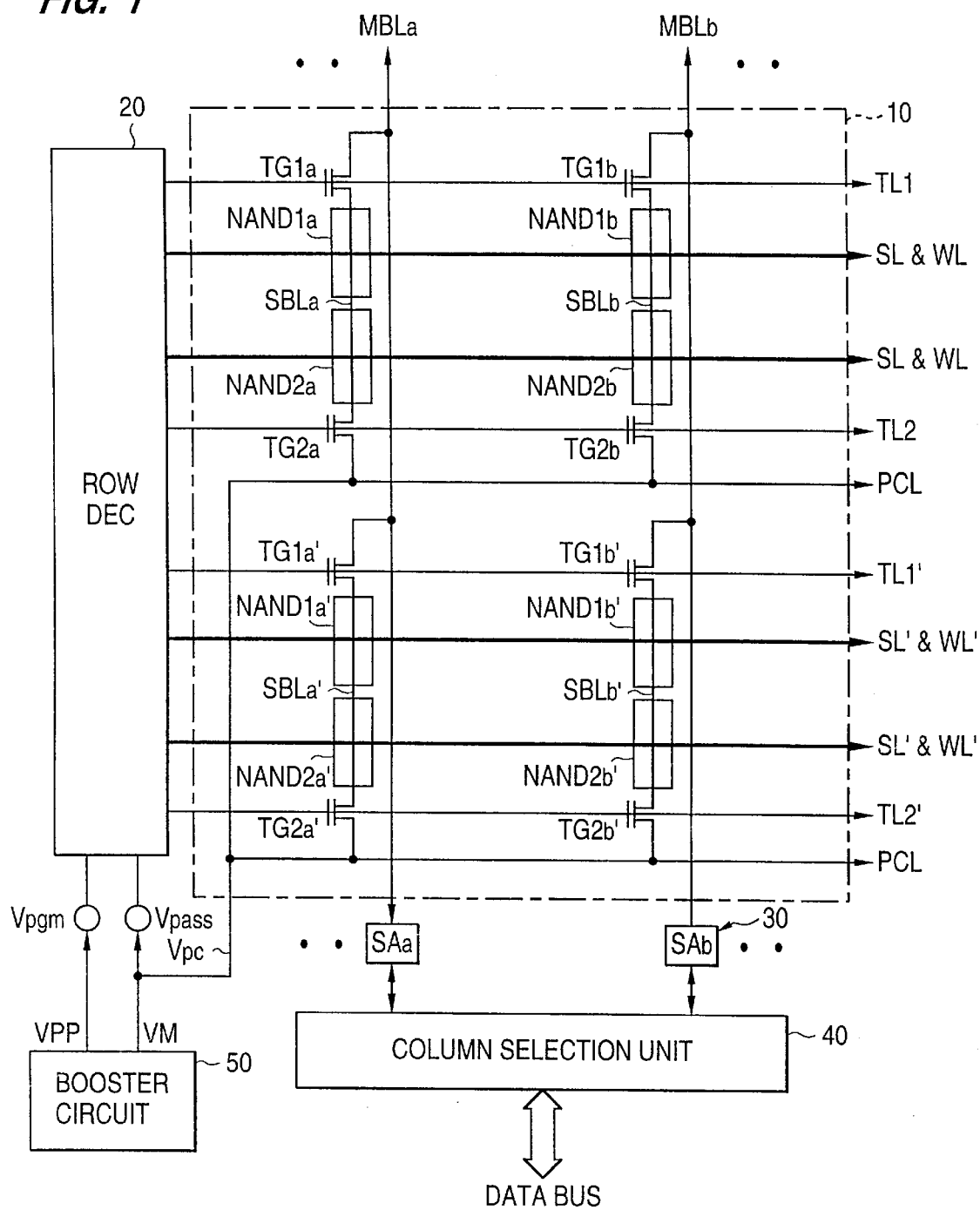
FIG. 1 is a view of an example of the configuration of a NAND type semiconductor nonvolatile memory device according to a first embodiment of the present invention.

FIG. 1 is a view of an example of the configuration of a NAND type semiconductor nonvolatile memory device according to a first embodiment of the present invention.

The NAND type semiconductor nonvolatile memory device of FIG. 1 is constituted by a memory array 10, a row decoder 20, a group of data latch circuits 30, a column selection unit 40, and a booster circuit 50.

The NAND type semiconductor nonvolatile memory device of FIG. 1 is comprised of a memory array comprising two main bit lines, two sub bit lines divided for every main bit line, and two NAND strings connected for every sub bit line for convenience, but in an actual memory array, in the case of a memory of for example 64 Mbits, the number of the main bit lines is 512 bytes (about 4k), 16 sub bit lines are divided for every main bit line, 64 NAND strings are connected to every sub bit line, and about 16 memory transistors are connected in series to each NAND string.

In the memory array 10, MBL$a$ and MBL$b$ denote main bit lines, the main bit line MBL$a$ is divided into the sub bit lines SBL$a$ and SBL$a$', and the main bit line MBL$b$ is divided into the sub bit lines SBL$b$ and SBL$b$'.

The sub bit line SBL$a$ is connected to the main bit line MBL$a$ via the connection transistor TG1$a$ and connected to a precharging line PCL via the connection transistor TG2$a$.

The sub bit line SBL$a$' is connected to the main bit line MBL$a$ via the connection transistor TG1$a$' and connected to the precharging line PCL via the connection transistor TG2$a$'.

The sub bit line SBL$b$ is connected to the main bit line MBL$b$ via the connection transistor TG1$b$ and connected to the precharging line PCL via the connection transistor TG2$b$.

The sub bit line SBL$b$' is connected to the main bit line MBL$b$ via the connection transistor TG1$b$' and connected to the precharging line PCL via the connection transistor TG2$b$'.

The connection transistors TG1$a$ and TG1$b$ are controlled by the connection control line TL1, the connection transistors TG1$a$' and TG1$b$' are controlled by the connection control line TL1', the connection transistors TG2$a$ and TG2$b$ are controlled by the connection control line TL2, and the connection transistors TG2$a$' and TG2$b$' are controlled by the connection control line TL2'.

The sub bit line SBL$a$ is connected to the NAND strings NAND1$a$ and NAND2$a$, the sub bit line SBL$a$' is connected to the NAND strings NAND1$a$' and NAND2$a$', the sub bit line SBL$b$ is connected to the NAND strings NAND1$b$ and NAND2$b$, and the sub bit line SBL$b$' is connected to the NAND strings NAND1$b$' and NAND2$b$'.

Each NAND string is constituted by serially connected selection transistors and memory transistors and controlled by selection gate lines SL (SL') and word lines WL (WL').

The main bit line MBL$a$ is connected to a data latch circuit SA$a$, while the main bit line MBL$b$ is connected to a data latch circuit SA$b$.

The booster circuit 50 generates a high voltage VPP and an intermediate voltage VM at the time of a data programming operation, supplies the program voltage Vpgm (VPP) and the pass voltage Vpass (VM) to the row decoder 20, and supplies a precharging voltage Vpc (VM) for prohibit the programming to the precharging line PCL.

Figure 2:
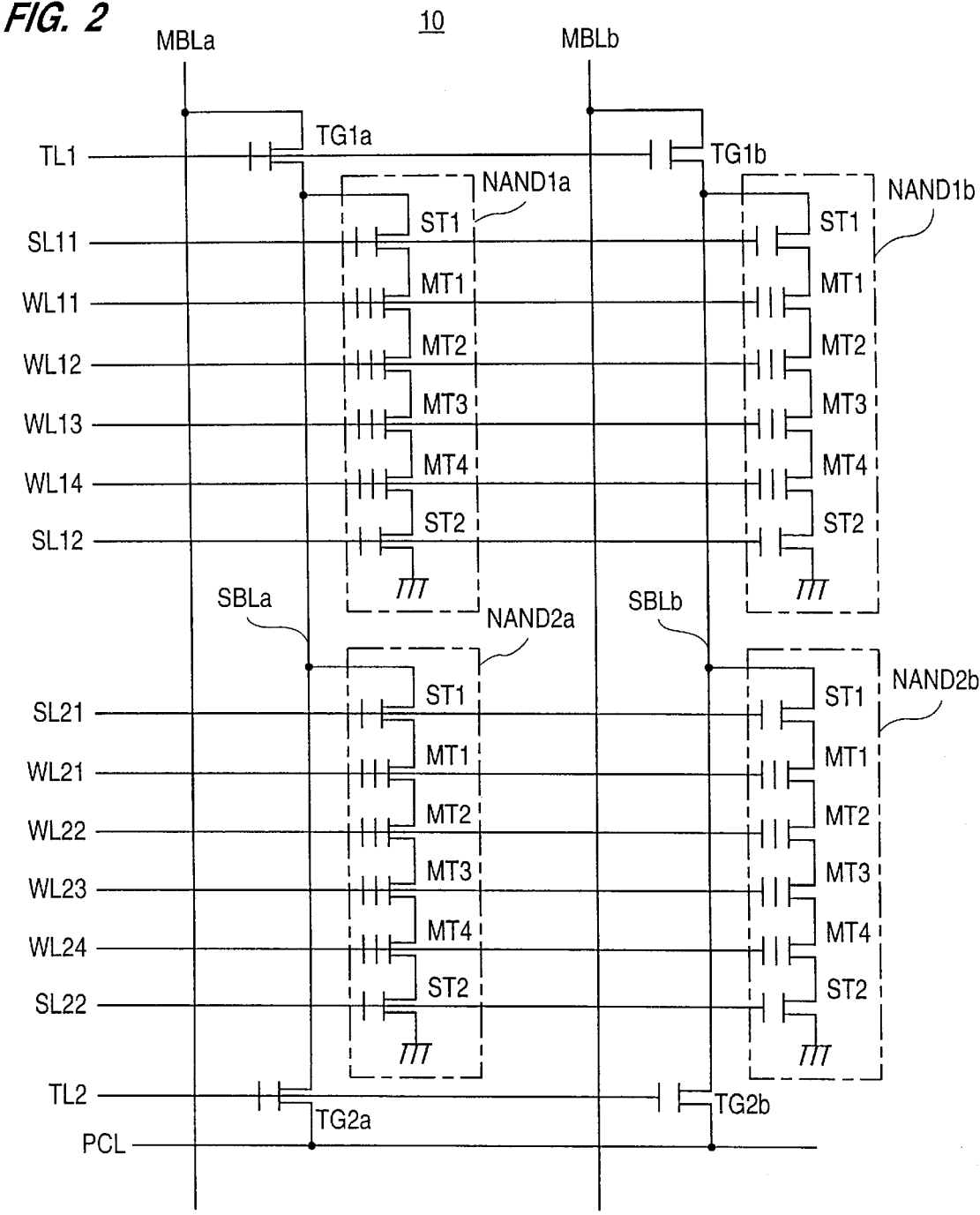
FIG. 2 is a view of the detailed configuration of a memory array in FIG. 1.

FIG. 2 is a view of the detailed configuration of the memory array 10 in the NAND type semiconductor nonvolatile memory device of FIG. 1. Only two main bit lines and one sub bit line for every main bit line are illustrated for convenience.

In FIG. 2, the main bit line MBLa is divided into the sub bit line SBLa, and the main bit line MBLb is divided into the sub bit line SBLb.

The sub bit line SBLa is connected to the main bit line MBLa via the connection transistor TG1a and connected to the precharging line PCL via the connection transistor TG2a.

The sub bit line SBLb is connected to the main bit line MBLb via the connection transistor TG1b and connected to the precharging line PCL via the connection transistor TG2b.

The connection transistors TG1a and TG1b are controlled by the connection control line TL1, and the connection transistors TG2a and TG2b are controlled by the connection control line TL2.

The NAND strings NAND1a and NAND2a are connected to the sub bit line SBLa, and the NAND strings NAND1b and NAND2b are connected to the sub bit line SBLb.

Each NAND string is constituted by two serially connected selection transistors ST1 and ST2 and four memory transistors MT1 to MT4.

In the NAND strings NAND1a and NAND1b, the selection transistor ST1 is controlled by the selection gate line SL11, the selection transistor ST2 is controlled by the selection gate line SL12, and the memory transistors MT1 to MT4 are respectively controlled by the word lines WL11 to WL14.

In the NAND strings NAND2a and NAND2b, the selection transistor ST1 is controlled by the selection gate line SL21, the selection transistor ST2 is controlled by the selection gate line SL22, and the memory transistors MT1 to MT4 are respectively controlled by the word lines WL21 to WL24.

Note that, in the configuration of FIG. 2, for convenience, four memory transistors are connected in series to one NAND string, but in an actual configuration, about 16 memory transistors are connected in series to one NAND string.

Figure 3:
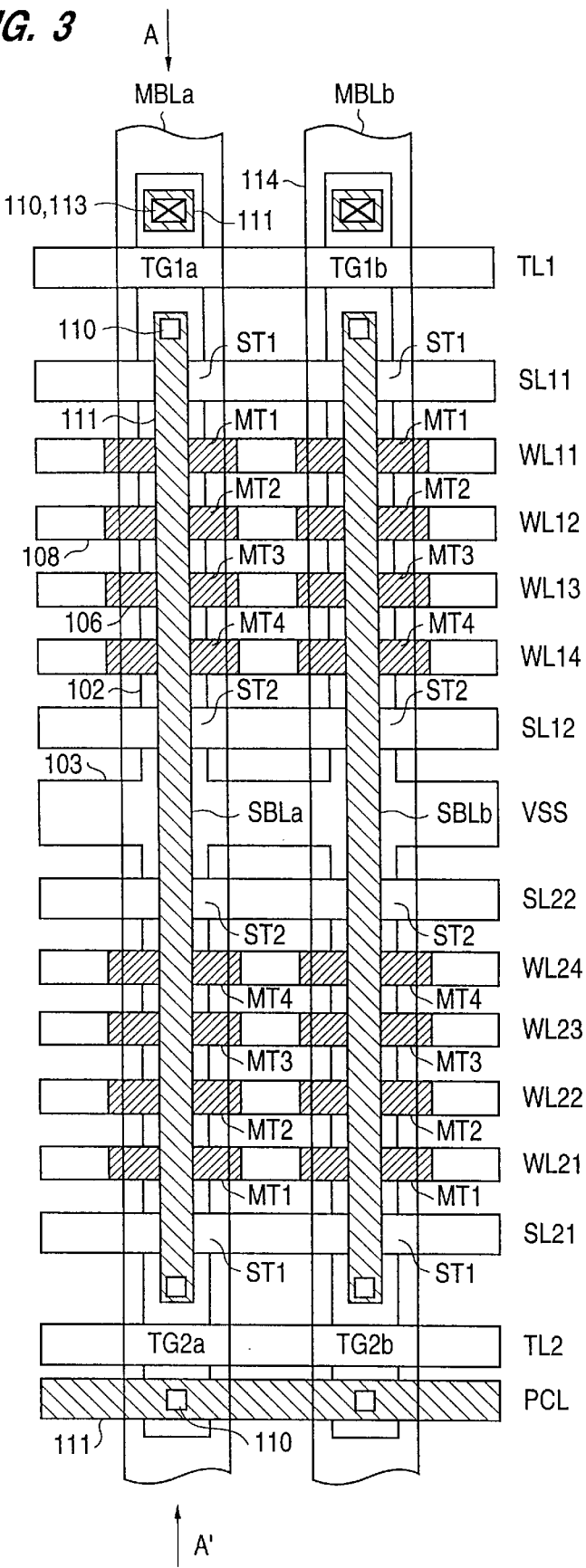
FIG. 3 is a view of a pattern layout of FIG. 2.

FIG. 3 is a view of the pattern layout of the NAND type semiconductor nonvolatile memory device of FIG. 2.

Figure 4:
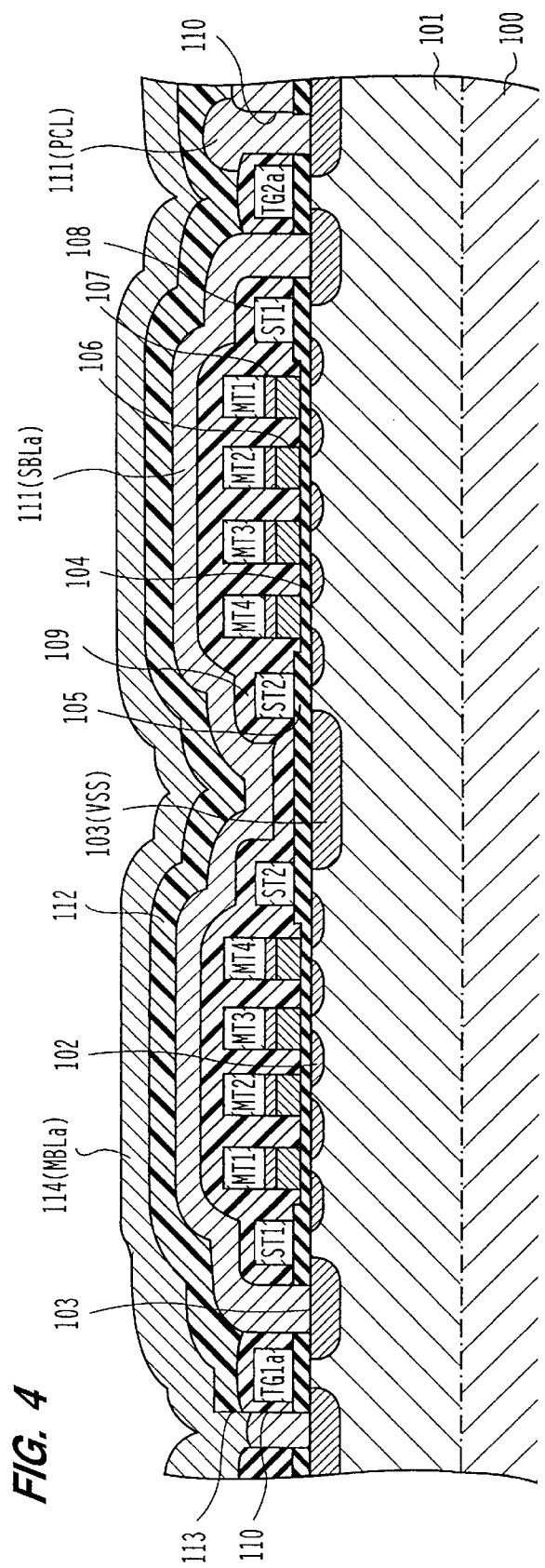
FIG. 4 is a sectional view of a device structure in the pattern layout of FIG. 3.

Further, FIG. 4 is a sectional view of a device structure in a direction A-A' in the pattern layout of FIG. 3.

In FIG. 3 and FIG. 4, 100 denotes a semiconductor substrate, 101 denotes a P-type well region in which a memory array region is formed, 102 denotes a source and drain N-type diffusion layer of a memory transistor, 103 denotes a VSS interconnection and an N-type diffusion layer of a bit contact portion, 104 denotes a tunnel oxide film, 105 denotes a gate oxide film of a selection transistor portion, 106 denotes a first layer polycrystalline silicon gate electrode forming a floating gate electrode, 107 denotes an ONO-3 layer insulation film, 108 denotes second layer polycrystalline silicon interconnections forming control gate electrodes of the memory transistors and selection transistors, 109 an inter-layer insulation film under the third layer polycrystalline silicon interconnections, 110 a contact hole under the third layer polycrystalline silicon interconnections, 111 third layer polycrystalline silicon interconnections forming the sub bit lines and precharging lines, 112 an inter-layer insulation film under the aluminum interconnections, 113 a contact hole under the aluminum interconnections, and 114 aluminum interconnections forming the main bit lines.

Next, an explanation will be made of a data programming operation in the NAND type semiconductor nonvolatile memory devices of FIG. 1 and FIG. 2 in relation to FIG. 5.

Figure 5:
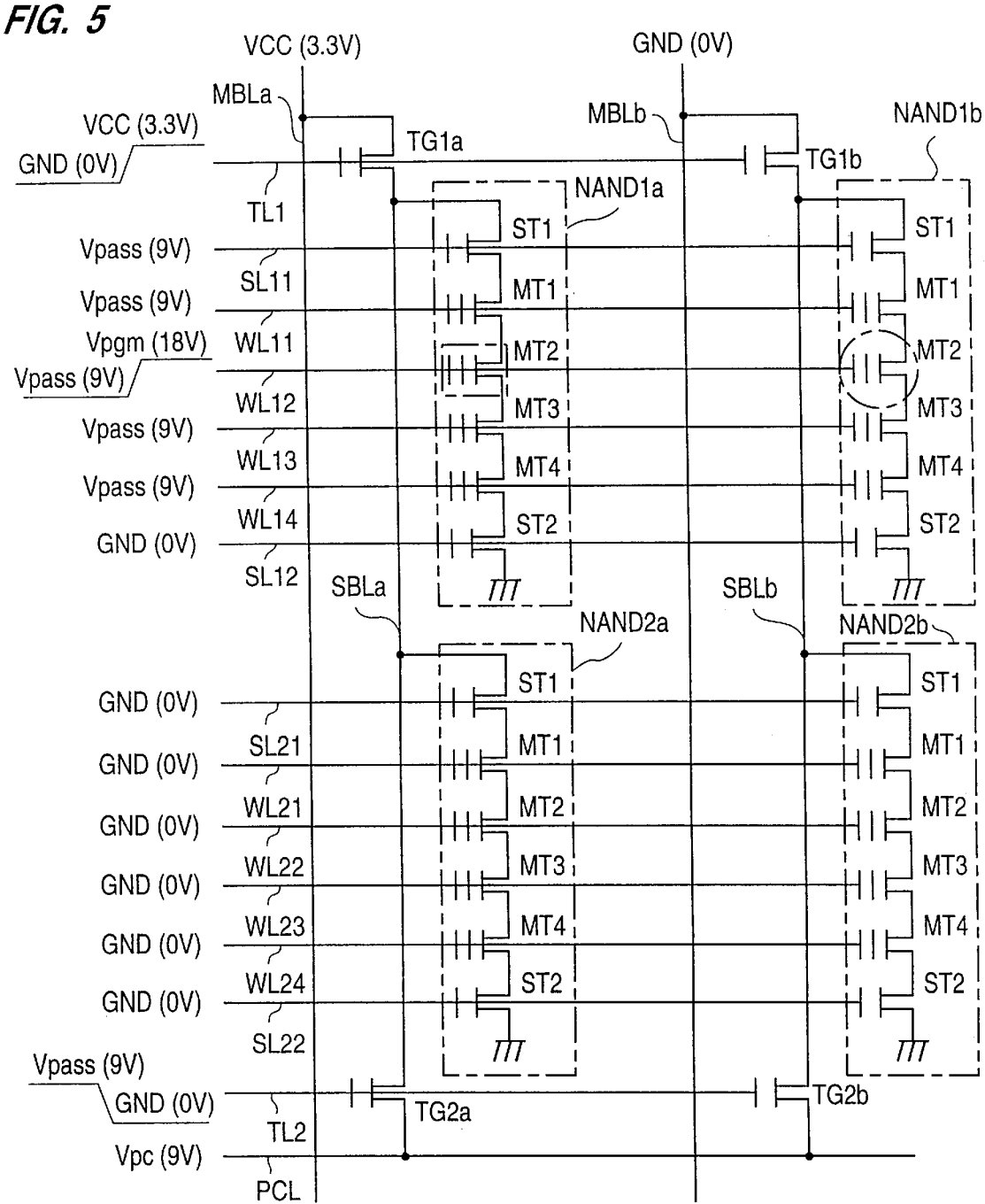
FIG. 5 is a view for explaining a data programming operation in a NAND type semiconductor nonvolatile memory device of the first embodiment.

FIG. 5 is a view explaining an operation where MT2 in the NAND string NAND1a is a memory transistor for which programming is prohibited and MT2 in the NAND string NAND1b is a memory transistor which is to be programmed when page programming is carried out by selecting the word line WL12.

First, in a state where the ground voltage GND (0 V) is supplied to the connection control line TL1 and the sub bit lines SBLa and SBLb are separated from the main bit lines MBLa and MBLb, the pass voltage Vpass (9 V) is supplied to the connection control line TL2. By this, the sub bit lines SBLa and SBLb are charged from the precharging line PCL to the precharging voltage (9 V) prohibiting the programming.

Simultaneously, the ground voltage GND (0 V) is supplied to the selection gate line SL12, and the pass voltage Vpass (9 V) is supplied to the selection gate line SL11 and the word lines WL11 to WL14. By this, the channel portions of the NAND strings NAND1a and NAND1b are charged up to the programming prohibit voltage (9 V) via the sub bit lines SBLa and SBLb.

At this time, in the non-selected NAND strings NAND2a and NAND2b, the ground voltage GND (0 V) is supplied to the selection gate lines SL21 and SL22 and the word lines WL21 and WL24, therefore the NAND strings are isolated from the sub bit lines and the voltage is not supplied to the memory transistor.

Next, in a state where the connection control line TL2 falls to the ground voltage GND (0 V) and the sub bit lines SBLa and SBLb are isolated from the precharging line PCL, the connection control line TL1 is raised to the power supply voltage VCC (3.3 V) and the sub bit lines SBLa and SBLb are connected to the main bit lines MBLa and MBLb.

Here, the main bit line MBLa to which the memory transistor for which programming is prohibited (MT2 in the NAND1a) is connected is set to the power supply voltage VCC (3.3 V), and the main bit line MBLb to which the memory transistor which is to be programmed (MT2 in the NAND1b) is connected is set to the ground voltage GND (0 V) via respectively corresponding data latch circuits.

As a result, the channel portion of the NAND string NAND1a and the sub bit line SBLa are held at the programming prohibit potential while holding the floating state, but the programming prohibit potential of the channel portion of the NAND string NAND1b and the sub bit line SBLb is discharged to the main bit line MBLb.

Simultaneously, the voltage supplied to the selected word line WL12 is raised to the programming voltage Vpgm (18 V).

As a result, the memory transistor MT2 in the NAND string NAND1a is held in the erasing state by the programming prohibit voltage, the data is programmed in the memory transistor MT2 in the NAND string NAND1b by the program voltage Vpgm, and the threshold voltage shifts in the positive direction and becomes for example –3 V to about 2 V of the erasing state.

In the embodiment of FIG. 5 explained above, the charging capacity can be greatly reduced in comparison with the system of the related art of charging the potential of the non-selected NAND string channel portion up to the programming prohibit potential via the main bit line. Therefore, the embodiment is suited to a low voltage operation and further the layout of the data latch circuits is easy.

Further, it is possible to set the programming prohibit potential to a sufficiently high voltage (about 9 V) in comparison with the self-boost operation of the related art of raising the potential of the NAND string channel portion by the capacity coupling of the voltage supplied to the word lines.

Accordingly, the disturb tolerance with respect to the non-selected memory transistors can be improved.

FIGS. 6A to 6H are timing charts of the operation explained in related to FIG. 5 explained above.

Below, the data programming operation of FIG. 5 will be explained in further detail by referring to the timing charts of FIGS. 6A to 6H.

First, ØP/R shown in FIG. 6A is a program/verify control signal, a first programming/verifying operation is carried out in a period from the time t1 to t4 in the figure, and a second programming/verifying operation is carried out in a period from the time t4 to t7.

First, the first programming operation is commenced at the time t1. As shown in FIGS. 6B and 6D, the ground voltage GND (0 V) is supplied to the connection control line TL1 and the selection gate line SL12, and as shown in FIGS. 6C, 6E, and 6F, the pass voltage Vpass (9 V) is supplied to the connection control line TL2, selection gate line SL11, and all word lines WL.

As a result, as shown in FIGS. 6G and 6H, the channel portion potential VCH$a$ of the NAND string NAND1$a$ and the channel portion potential VCH$b$ of the NAND string NAND1$b$ are charged up to the programming prohibit voltage Vpc (9 V) via the sub bit line and the precharging line.

Next, as shown in FIGS. 6C and 6B, at the time t2, the connection control line TL2 falls to the ground voltage GND (0 V), and the connection control line TL1 is raised to the power supply voltage VCC (3.3 V).

As a result, as shown in FIGS. 6G and 6H, the channel portion potential VCH$a$ at which the memory transistor for which programming is prohibited keeps the programming prohibit potential while holding the floating state, but the programming prohibit potential of the VCH$b$ at which the memory transistor which is to be programmed is discharged to the main bit line and becomes GND (0 V).

On the other hand, as shown in FIG. 6E, the program voltage Vpgm (18 V) is supplied to the selected word line. During the period from the time t2 to t3, page programming is carried out together for memory transistors connected to the word line.

Next, the period from the time t3 to t4 is a first verifying operation period. As shown in FIGS. 6C and 6E, the power supply voltage VCC and the ground voltage GND are supplied to the connection control line TL2 and the selected word line, respectively, and as shown in FIGS. 6B, 6F, and 6D, the power supply voltage VCC is supplied to the connection control line TL1 and all non-selected word lines and the selection gate lines SL11 and SL12. A verifying operation similar to that of the usual NAND type flash memory is carried out in the pass state.

Further, the period from the time t4 to t7 is a second programming/verifying operation period. This is a repetition of the first programming/verifying operation.

FIG. 7 is a view of the setting of the biases for the programming operation, the erasing operation, and the reading operation already explained with regard to the NAND type semiconductor nonvolatile memory device of the first embodiment of the present invention of FIG. 1 to FIG. 6.

Note that, in the figure, the programming operation is for convenience shown divided into an operation at the time of precharging (times t1 to t2 in FIG. 6) and an operation at the time of the real programming (times t2 to t3 in FIG. 6).

In FIG. 7, the programming operation is as already explained, so a repeat explanation will be omitted.

The erasing operation is basically the same as that of the NAND type flash memory of the related art. 0 V is supplied to all word lines of the selected NAND string block, and a high voltage (Verase=22 V) is supplied to all word lines of the non-selected NAND string blocks and the substrate PWELL of the memory array.

As a result, electrons are pulled out of the floating gates of the memory transistors of the selected NAND string block to the substrate. The threshold voltage of the memory transistor shifts in the negative direction and becomes for example about −3 V.

Also, the reading operation is basically the same as that of the NAND type flash memory of the related art. In the selected NAND string block, the ground voltage GND is supplied to the selected word line, the power supply voltage VCC is supplied to all non-selected word lines, the selected gate line SL, and the connection control line TL1, and a reading operation similar to that of the usual NAND type flash memory is carried out in the pass state.

As explained above, the NAND type semiconductor nonvolatile memory device of the first embodiment is configured by a memory array in which a main bit line is divided into sub bit lines. When the memory transistor is a memory transistor for which programming is prohibited, the potential of the NAND string channel portion is charged up to the programming prohibit potential.

Accordingly, since the charging capacity can be greatly reduced in comparison with a system of the related art for charging the potential of the non-selected NAND string channel portion up to the programming prohibit potential via the main bit line, the memory is suited to a low voltage operation and further the layout of the data latch circuits becomes easy.

Further, it is possible to set the programming prohibit potential to a sufficiently high voltage in comparison with a self-boost operation of raising the potential of the NAND string channel portion by the capacity coupling of the voltage supplied to the word lines.

For this reason, the disturb tolerance at the time of the data programming can be improved.

Second Embodiment

Figure 8:
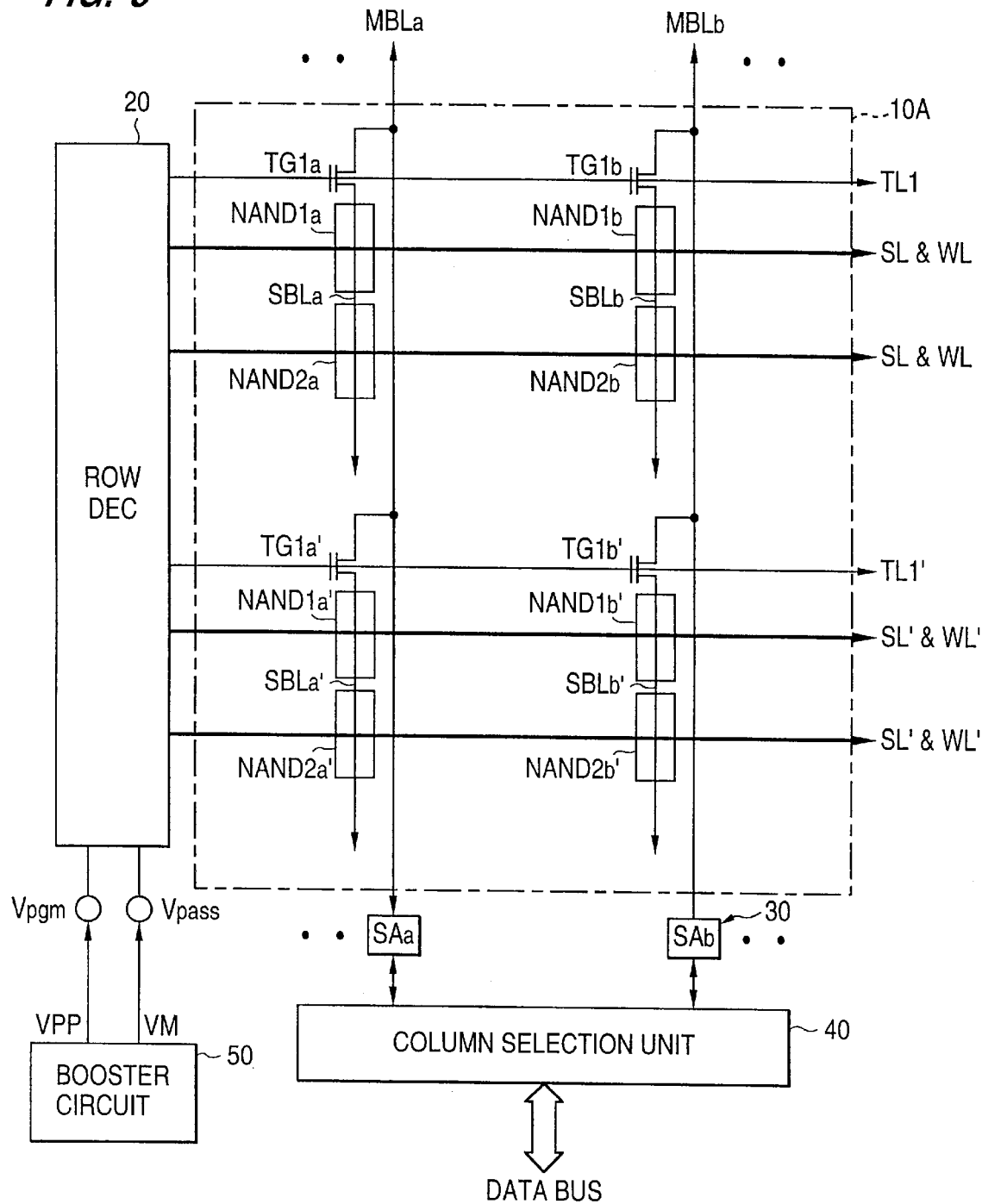
FIG. 8 is a view of an example of the configuration of a NAND type semiconductor nonvolatile memory device according to a second embodiment of to the present invention.

FIG. 8 is a view of an example of the configuration of a NAND type semiconductor nonvolatile memory device according to a second embodiment of the present invention.

The difference of the second embodiment from the first embodiment resides in that, in a state where the gate potential of the selection transistor is held at the power supply voltage VCC level after supplying the programming prohibit voltage (9 V) from the main bit line to the sub bit line via the selection transistor without using the precharging line, the selected main bit line is set to the ground voltage GND, the non-selected main bit line is set to the power supply voltage VCC, and the non-selected sub bit lines are placed in the floating state.

The NAND type semiconductor nonvolatile memory device of FIG. 8 is constituted by a memory array 10A, a row decoder 20, a group of data latch circuits 30, a column selection unit 40, and a booster circuit 50.

The NAND type semiconductor nonvolatile memory device of FIG. 8 is shown for convenience as a memory array comprising two main bit lines, two sub bit lines divided for every main bit line, and two NAND strings connected for every sub bit line, but in an actual memory array, in the case of a memory of for example 64 Mbits, there are 512 bytes (about 4k) worth of the main bit lines, 16 sub bit lines divided for every main bit line, and about 16 memory transistors connected in series to each NAND string.

In the memory array 10A, MBL$a$ and MBL$b$ denote main bit lines, the main bit line MBL$a$ is divided into the sub bit lines SBL*a* and SBL*a*', and the main bit line MBL*b* is divided into the sub bit lines SBL*b* and SBL*b*'.

One end of the sub bit line SBL*a* is connected to the main bit line MBL*a* via the connection transistor TG1*a*, while the sub bit line SBL*a*' is connected to the main bit line MBL*a* via the connection transistor TG1*a*'.

The sub bit line SBL*b* is connected to the main bit line MBL*b* via the connection transistor TG1*b*, while the sub bit line SBL*b*' is connected to the main bit line MBL*b* via the connection transistor TG1*b*'.

The connection transistors TG1*a* and TG1*b* are controlled by the connection control line TL1, while the connection transistors TG1*a*' and TG1*b*' are controlled by the connection control line TL1'.

The sub bit line SBL*a* is connected to the NAND strings NAND1*a* and NAND2*a*, the sub bit line SBL*a*' is connected to the NAND strings NAND1*a*' and NAND2*a*', the sub bit line SBL*b* is connected to the NAND strings NAND1*b* and NAND2*b*, and the sub bit line SBL*b*' is connected to the NAND strings NAND1*b*' and NAND2*b*'

Each NAND string is constituted by serially connected selection transistors and memory transistors and controlled by selection gate lines SL (SL') and word lines WL (WL').

The main bit line MBL*a* is connected to a data latch circuit SA*a*, while the main bit line MBL*b* is connected to a data latch circuit SA*b*.

The booster circuit 50 generates a high voltage VPP and an intermediate voltage VM at the time of a data programming operation and supplies the program voltage Vpgm (VPP) and the pass voltage Vpass (VM) to the row decoder 20.

Figure 9:
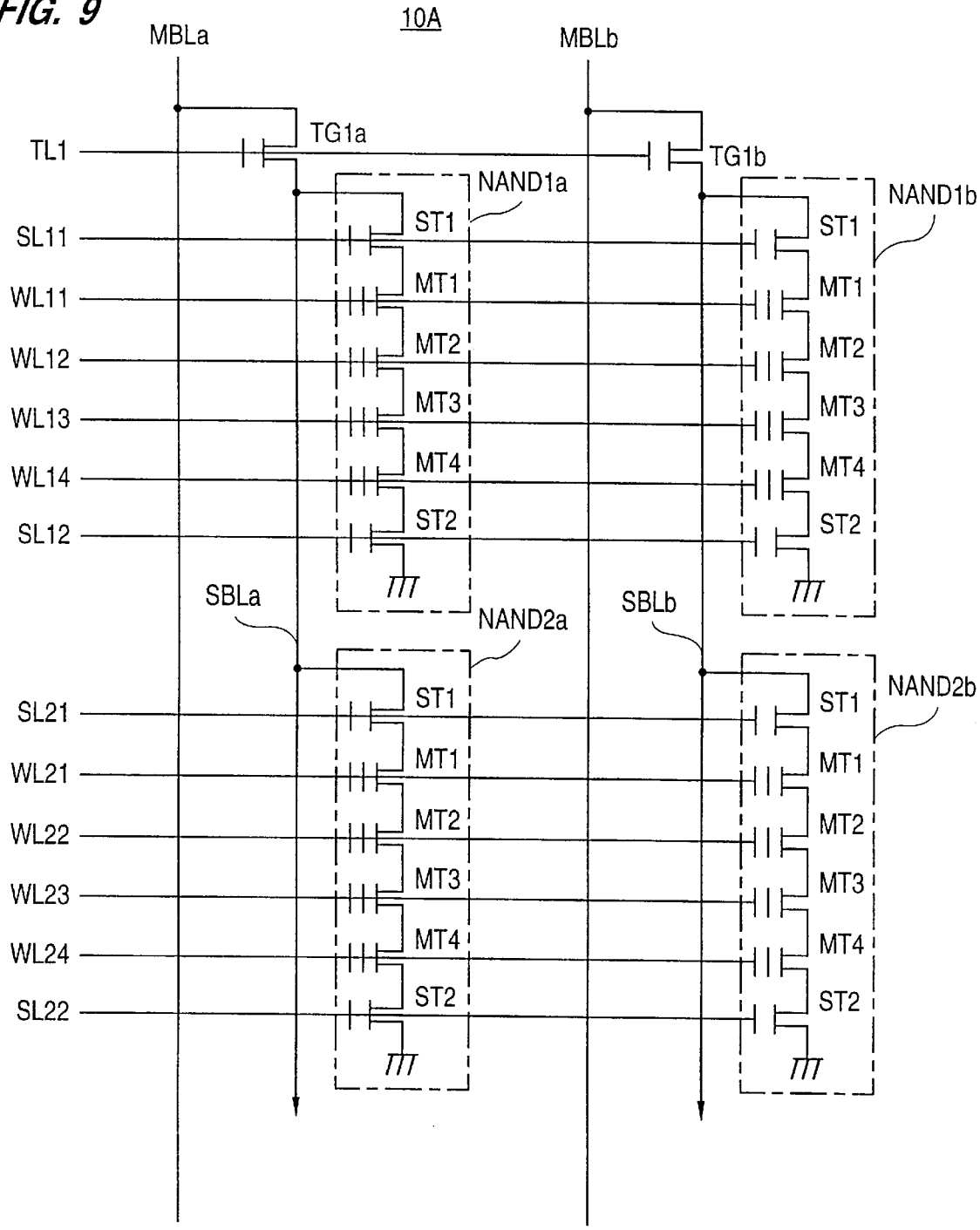
FIG. 9 is a view of the detailed configuration of the memory array in FIG. 8.

FIG. 9 is a view of the detailed configuration of the memory array 10A in the NAND type semiconductor non-volatile memory device of FIG. 8. Only two main bit lines and one sub bit line for every main bit line are illustrated for convenience.

In FIG. 9, the main bit line MBL*a* is divided into the sub bit line SBL*a*, and the main bit line MBL*b* is divided into the sub bit line SBL*b*.

The sub bit line SBL*a* is connected to the main bit line MBL*a* via the connection transistor TG1*a*, and the sub bit line SBL*b* is connected to the main bit line MBL*b* via the connection transistor TG1*b*.

The connection transistors TG1*a* and TG1*b* are controlled by the connection control line TL1.

The NAND strings NAND1*a* and NAND2*a* are connected to the sub bit line SBL*a*, while the NAND strings NAND1*b* and NAND2*b* are connected to the sub bit line SBL*b*.

Each NAND string is constituted by two serially connected selection transistors ST1 and ST2 and four memory transistors MT1 to MT4.

In the NAND strings NAND1*a* and NAND1*b*, the selection transistor ST1 is controlled by the selection gate line SL11, the selection transistor ST2 is controlled by the selection gate line SL12, and the memory transistors MT1 to MT4 are respectively controlled by the word lines WL11 to WL14.

In the NAND strings NAND2*a* and NAND2*b*, the selection transistor ST1 is controlled by the selection gate line SL21, the selection transistor ST2 is controlled by the selection gate line SL22, and the memory transistors MT1 to MT4 are respectively controlled by the word lines WL21 to WL24.

Note that, in the configuration of FIG. 9, for convenience, four memory transistors are connected in series to one NAND string, but in an actual configuration, the number of memory transistors to be connected in series to one NAND string is about 16.

Figure 10:
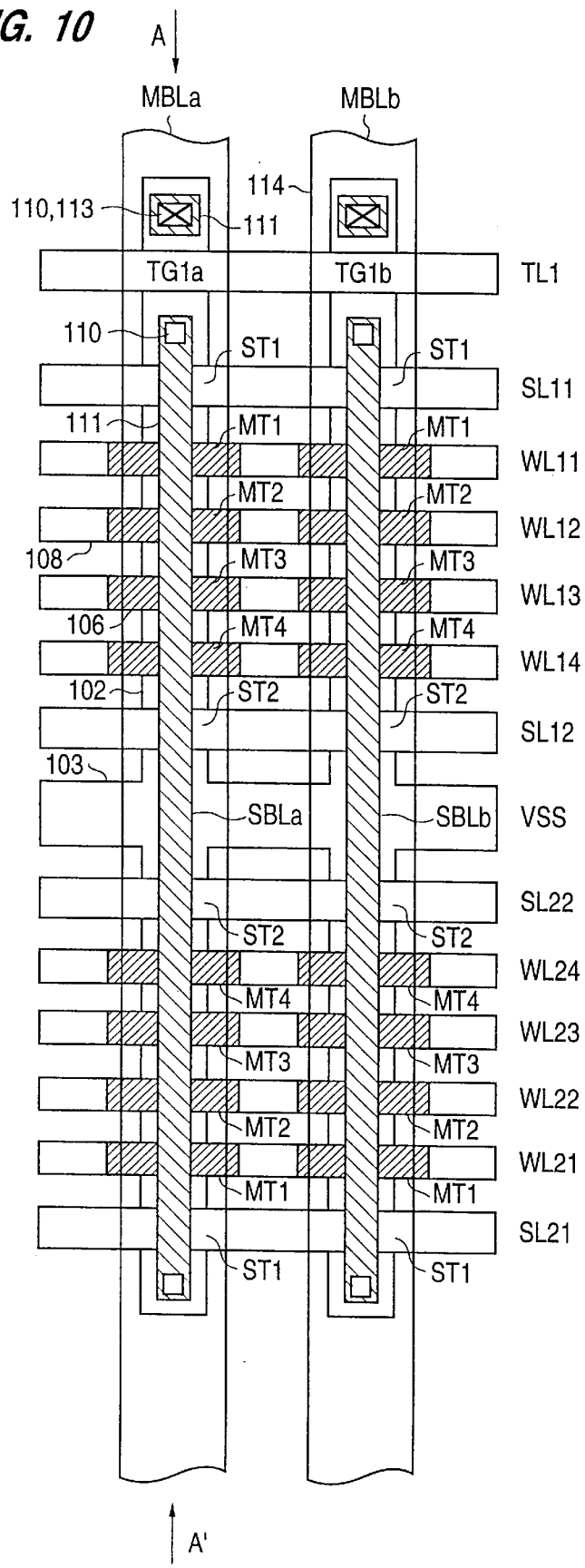
FIG. 10 is a view of the pattern layout of FIG. 9.

FIG. 10 is a view of the pattern layout of the NAND type semiconductor nonvolatile memory device of FIG. 9.

Figure 11:
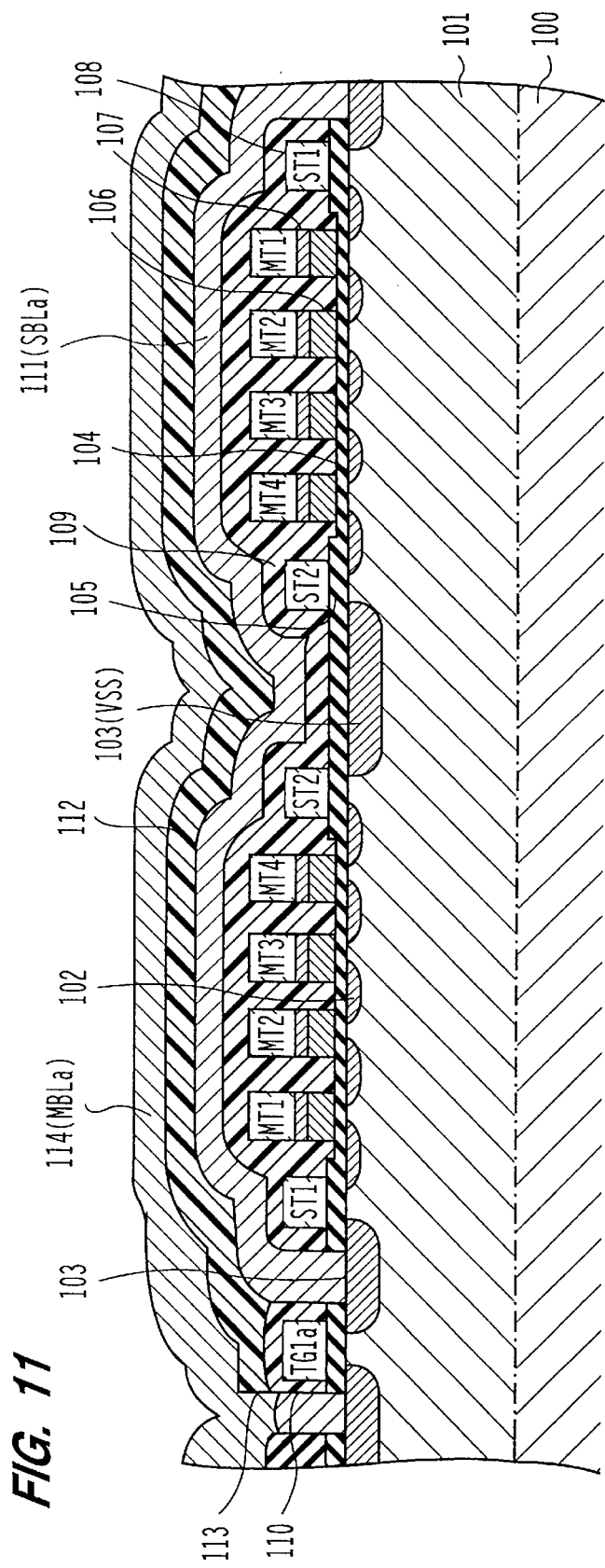
FIG. 11 is a sectional view of the device structure in the pattern layout of FIG. 10.

Further, FIG. 11 is a sectional view of a device structure in a direction A-A' in the pattern layout of FIG. 10.

In FIG. 10 and FIG. 11, 100 denotes a semiconductor substrate, 101 denotes a P-type well region in which a memory array region is formed, 102 denotes a source and drain N-type diffusion layer of a memory transistor, 103 denotes a VSS interconnection and an N-type diffusion layer of a bit contact portion, 104 denotes a tunnel oxide film, 105 denotes a gate oxide film of a selection transistor portion, 106 denotes a first layer polycrystalline silicon gate electrode forming a floating gate electrode, 107 denotes an ONO-3 layer insulation film, 108 denotes second layer polycrystalline silicon interconnections forming control gate electrodes of the memory transistors and selection transistors, 109 denotes an inter-layer insulation film under the third layer polycrystalline silicon interconnections, 110 denotes a contact hole under the third layer polycrystalline silicon interconnections, 111 denotes third layer polycrystalline silicon interconnections forming the sub bit lines and precharging lines, 112 denotes an inter-layer insulation film under the aluminum interconnections, 113 denotes a contact hole under the aluminum interconnections, and 114 denotes aluminum interconnections forming the main bit lines.

Next, an explanation will be made of the data programming operation in the NAND type semiconductor nonvolatile memory device of FIG. 8 and FIG. 9 in relation to FIG. 12.

Figure 12:
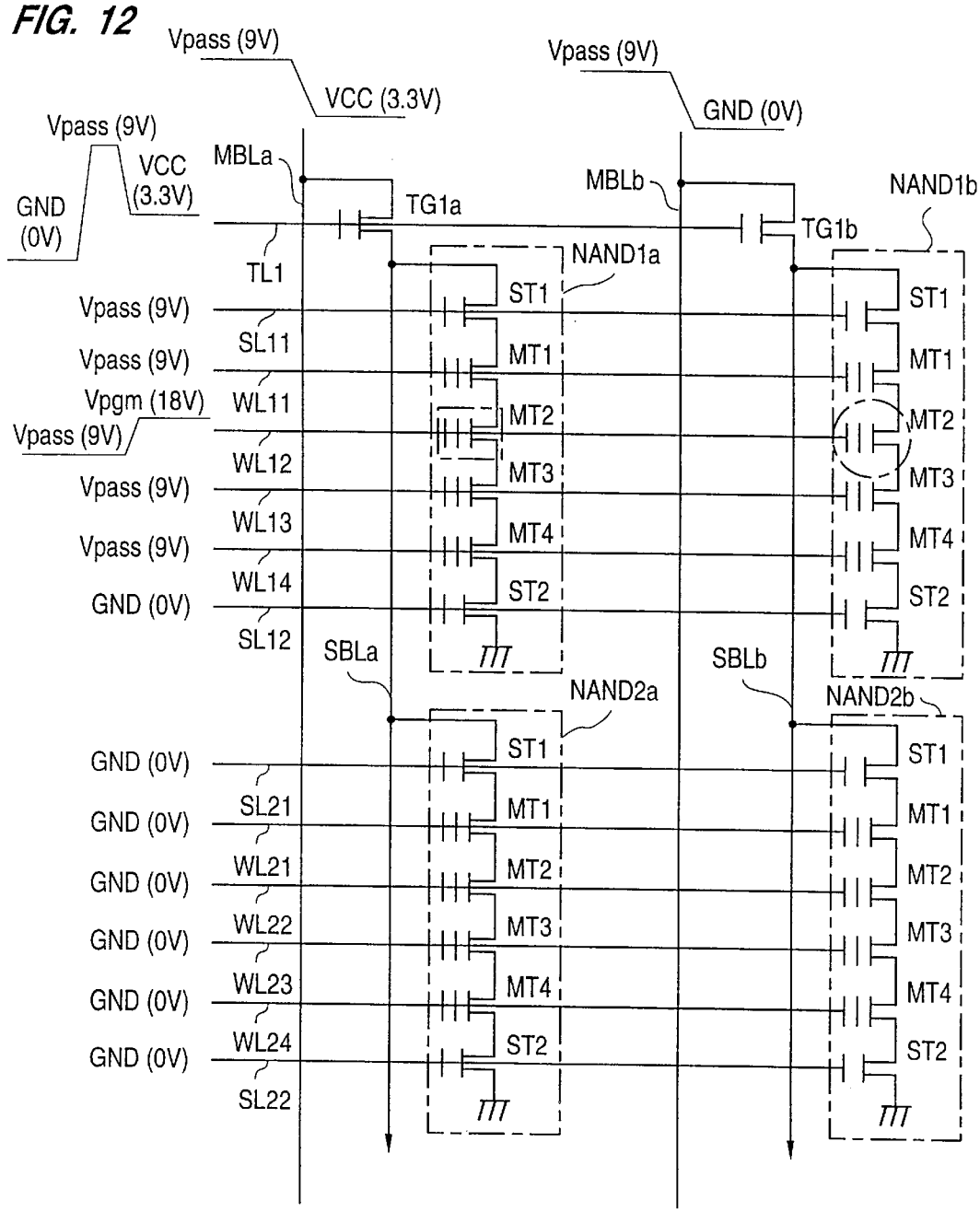
FIG. 12 is a view for explaining a data programming operation in the NAND type semiconductor nonvolatile memory device of the second embodiment.

FIG. 12 is a view for explaining an operation where MT2 in the NAND string NAND1*a* is a memory transistor for which programming is prohibited and MT2 in the NAND string NAND1*b* is a memory transistor which is to be programmed where page programming is carried out by selecting the word line WL12.

First, in a state where the ground voltage GND (0 V) is supplied to the connection control line TL1 and where the sub bit lines SBL*a* and SBL*b* are isolated from the main bit lines MBL*a* and MBL*b*, the pass voltage Vpass (9 V) is supplied to the main bit lines MBL*a* and MBL*b*. The pass voltage Vpass is supplied to the connection control line TL1 in this state, and the connection transistors TG1*a* and TG1*b* are controlled in the conductive state. By this, the sub bit lines SBL*a* and SBL*b* are charged up to the pass voltage Vpass (9 V) prohibiting the programming.

Simultaneously, the ground voltage GND (0 V) is supplied to the selection gate line SL12, and the pass voltage Vpass (9 V) is supplied to the selection gate lines SL11 and the word lines WL11 to WL14.

By this, the channel portions of the NAND strings NAND1*a* and NAND1*b* are charged up to the programming prohibit voltage (9 V) via the sub bit lines SBL*a* and SBL*b*.

At this time, in the non-selected NAND strings NAND2*a* and NAND2*b*, the ground voltage GND (0 V) is supplied to the selection gate lines SL21 and SL22 and the word lines WL21 and WL24, therefore the NAND strings are isolated from the sub bit lines, and voltage not supplied to the memory transistor.

Next, the connection control line TL1 falls to the power supply voltage VCC (3.3 V), the selected main bit line MBL*b* falls to the ground voltage GND (0 V) in this state, and the non-selected main bit line MBL*a* falls to the power supply voltage VCC (3.3 V).

By this, the connection transistor TG1*b* is held in the connection state, while the con nection transistor TG1*a* is in the out-off state.

A s a result, the channel portion of the NAND string NAND1*a* and the sub bit line SBL*a* are held at the programming prohibit potential while holding the floating state, but the programming prohibit potential of the channel portion of the NAND string NAND1b and the sub bit line SBLb is discharged to the main bit line MBLb.

Simultaneously. the voltage supplied to the selection word line WL12 is raised to the programming voltage Vpgm (18 V).

As a result, the memory transistor MT2 in the NAND string NAND1a is held in the erasing state by the programming prohibit voltage, data is programmed in the memory transistor MT2 in the NAND string NAND1b by the rpogram voltage Vpgm, and the threshold voltage shifts in the positive direction and becomes for example −3 V to about 2 V of the erasing state.

The embodiment of FIG. 12 explained above is suited to a low voltage operation and further the layout of the data latch circuits is easier in comparison with the system of the related art of charging the potential of the non-selected NAND string channel portion up to the programming prohibit potential via the main bit line.

Further, it is possible to set the programming prohibit potential to a sufficiently high voltage value (about 9 V) in comparison with the self-boost operation of the related art of raising the potential of the NAND string channel portion by capacity coupling of the word line application voltage.

Accordingly, the disturb tolerance with respect to the non-selected memory transistors can be improved.

As explained above, the NAND type semiconductor nonvolatile memory device of the present second embodiment, in the same way as in the first embodiment, is suited to a low voltage operation and further the layout of the data latch circuits becomes easy.

Further, in comparison with the self-boost operation of raising the potential of the NAND string channel portion by capacity coupling of the voltage supplied to the word lines, it is possible to set the programming prohibit potential to a sufficiently high voltage.

For this reason, the disturb tolerance at the time of data programming can be improved.

Third Embodiment

Figure 13:
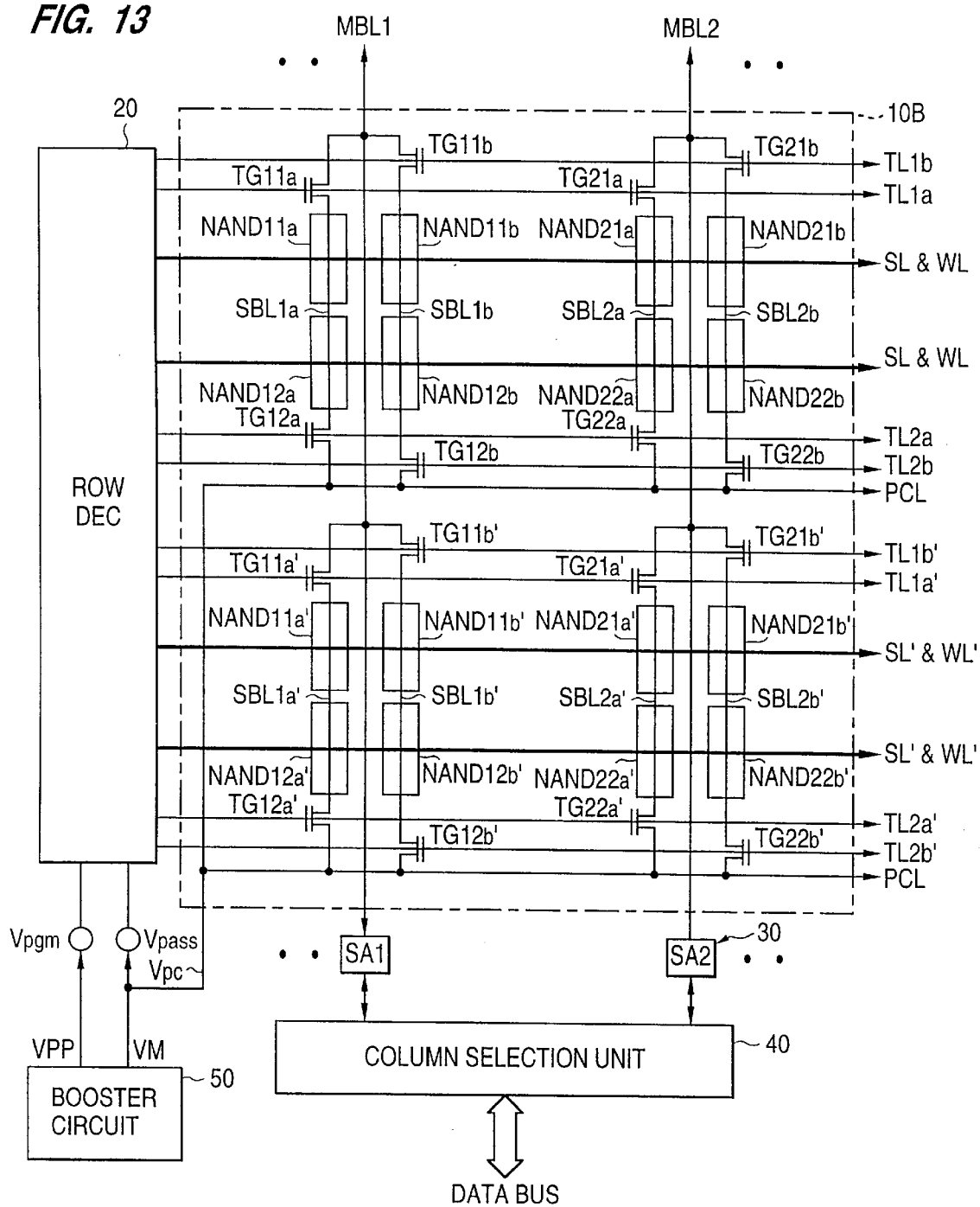
FIG. 13 is a view of an example of the configuration of a NAND type semiconductor nonvolatile memory device according to a third embodiment of the present invention.

FIG. 13 is a view of an example of the configuration of a NAND type semiconductor nonvolatile memory device according to a third embodiment of the present invention.

The difference of the example of the configuration of the third embodiment of FIG. 13 from the example of the configuration of the first embodiment of FIG. 1 resides in that a memory array is formed in which main bit lines are divided into pairs of first groups of sub bit lines and second groups of sub bit lines arranged in the column direction.

Accordingly, the pitch of the main bit lines in the column direction can be increased, therefore the layout of the bit contacts between the aluminum interconnections and diffusion layer and the data latch circuits becomes further easier.

In FIG. 13, 10B denotes a memory array, 20 denotes a row decoder, 30 denotes a group of data latch circuits, 40 denotes a column selection unit, and 50 denotes a booster circuit.

The NAND type semiconductor nonvolatile memory device of FIG. 13 is shown for convenience as a memory array comprising two main bit lines, a pair of groups of sub bit lines divided for every main bit line, two sub bit lines constituting each group of sub bit lines, and two NAND strings connected for every sub bit line, but in an actual memory array, in the case of a memory of for example 64 Mbits, there are 256 bytes (about 2k) worth of main bit lines, 16 sub bit lines constituting each group of sub bit lines, 64 NAND strings connected for every sub bit line, and about 16 memory transistors connected in series to each NAND string.

In the memory array 10B, MBL1 and MBL2 denote main bit lines, the main b it line MBL1 s divided into the pairs of sub bit lines SBL1a and SBL1a' and SBL1b and SBL1b', and the main bit line MBL2 is divided into the pairs of sub bit lines SBL2a and SBL2a' and SBL2b and SBL2b'.

The sub bit line SBL1a is connected to the main bit line MBL1 via the connection transistor TG11a and connected to the precharging line PCL via the connection transistor TG12a.

The sub bit line SBL1a' is connected to the main bit line MBL1 via the connection transistor TG11a' and connected to the precharging line PCL via the connection transistor TG12a'.

The sub bit line SBL1b is ccnnected to the main bit line MBL1 via the connection transistor TG11b and connected to the precharging line PCL via the connection transistor TG12b.

The sub bit line SBL1b' is connected to the main bit line MBL1 via the connection transistor TG11b' and connected to the precharging line PCL via the connection transistor TG12b'.

The sub bit line SBL2a is connected to the main bit line MBL2 via the connection transistor TG21a and connected to the precharging line PCL via the connection transistor TG22a.

The sub bit line SBL2a' is connected to the main bit line MBL2 via the connection transistor TG21a' and connected to the precharging line PCL via the connection transistor TG22a'.

The sub bit line SBL2b is connected to the main bit line MBL2 via the connection transistor TG21b and connected to the precharging line PCL via the connection transistor TG22b.

The sub bit line SBL2b' is connected to the main bit line MBL2 via the connection transistor TG21b' and connected to the precharging line PCL via the connection transistor TG22b'.

The connection transistors TG11a and TG21a are controlled by the connection control line TL1a, the connection transistors TG11b and TG21b are controlled by the connection control line TL1b, the connection transistors TG12a and TG22a are controlled by the connection control line TL2a, the connection transistors TG12b and TG22b are controlled by the connection control line TL2b, the connection transistors TG11a' and TG21a' are controlled by the connection control line TL1a', the connection transistors TG11b' and TG21b' are controlled by the connection control line TL1b', the connection transistors TG12a' and TG22a' are controlled by the connection control line TL2a', and the connection transistors TG12b' and TG22b' are controlled by the connection control line TL2b'.

The sub bit line SBL1a is connected to the NAND strings NAND11a and NAND12a, the sub bit line SBL1b is connected to the NAND strings NAND11b and NAND12b, the sub bit line SBL2a is connected to the NAND strings NAND21a and NAND22a, the sub bit line SBL2b is connected to the NAND strings NAND21b and NAND22b, the sub bit line SBL1a' is connected to the NAND strings NAND11a' and NAND12a', the sub bit line SBL1b' is connected to the NAND strings NAND11b' and NAND12b', the sub bit line SBL2a' is connected to the NAND strings NAND21a' and NAND22a', and the sub bit line SBL2b' is connected to the NAND strings NAND21b' and NAND22b'.

Each NAND string is constituted by serially connected selection transistors and memory transistors and controlled by selection gate lines SL (SL') and word lines WL (WL').

The main bit line MBL1 is connected to a data latch circuit SA1, while the main bit line MBL2 is connected to a data latch circuit SA2.

The booster circuit 50 generates a high voltage VPP and an intermediate voltage VM at the time of a data programming operation, supplies the program voltage Vpgm (VPP) and the pass voltage Vpass (VM) to the row decoder 20, and supplies a precharging voltage Vpc (VM) for prohibiting programming to the precharging line PCL.

Figure 14:
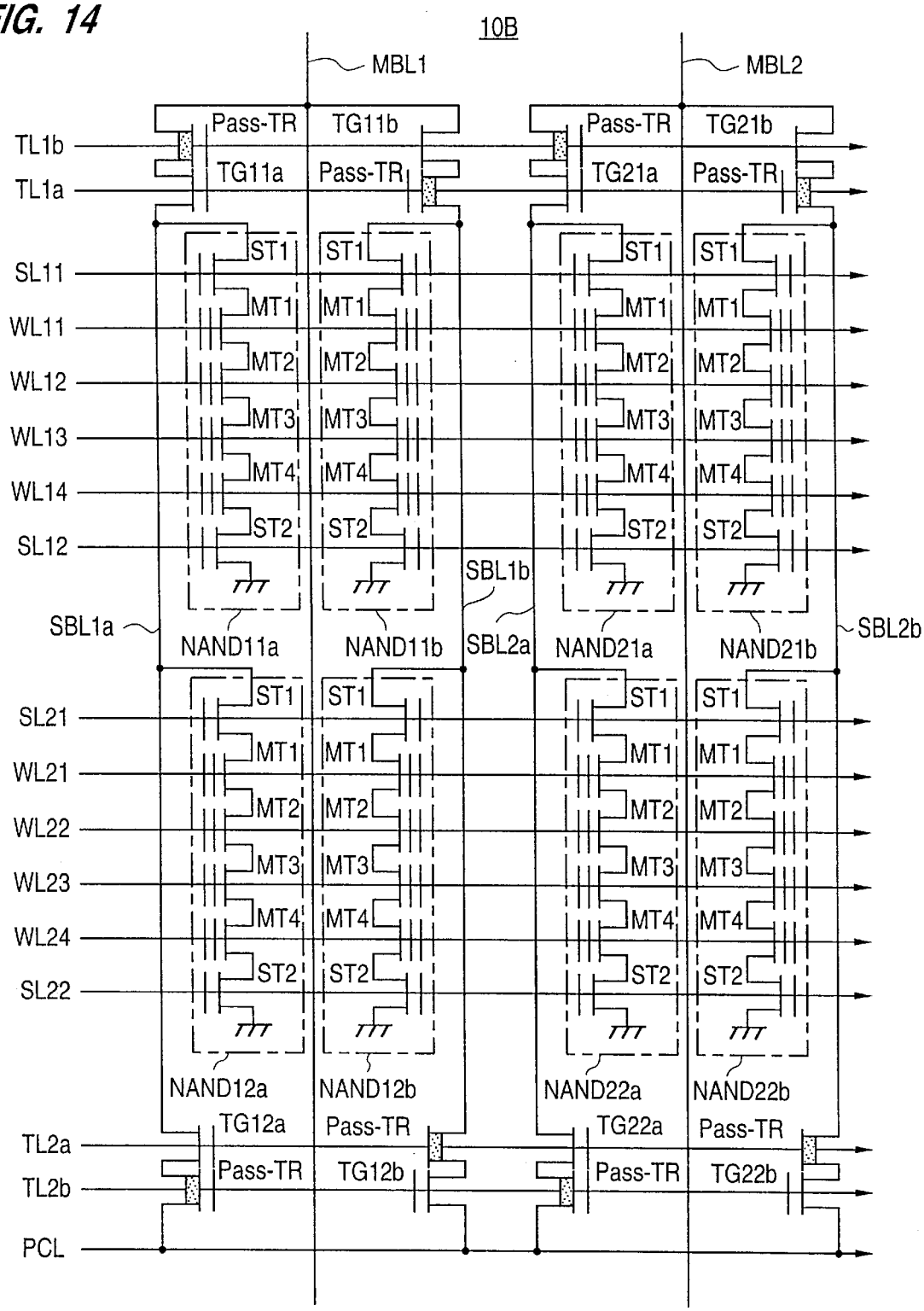
FIG. 14 is a view of the detailed configuration of the memory array in FIG. 13.

FIG. 14 is a view of the detailed configuration of the memory array 10B in the NAND type semiconductor nonvolatile memory device of FIG. 13. Only two main bit lines and one sub bit line are illustrated for every main bit line for convenience.

In FIG. 14, the main bit line MBL1 is divided into the pair of sub bit lines SBL1a and SBL1b, and the main bit line MBL2 is divided into the pair of sub bit lines SBL2a and SBL2b.

The sub bit line SBL1a is connected to the main bit line MBL1 via the serially connected connection transistor TG11a and pass transistor Pass-TR and connected to the precharging line PCL via the connection transistor TG12a and the pass transistor Pass-TR.

The sub bit line SBL1b is connected to the main bit line MBL1 via the serially connected connection transistor TG11b and pass transistor Pass-TR and connected to the precharging line PCL via the connection transistor TG12b and the pass transistor Pass-TR.

The sub bit line SBL2a is connected to the main bit line MBL2 via the serially connected connection transistor TG21a and pass transistor Pass-TR and connected to the precharging line PCL via the connection transistor TG22a and the pass transistor Pass-TR.

The sub bit line SBL2b is connected to the main bit line MBL2 via the serially connected connection transistor TG21b and pass transistor Pass-TR and connected to the precharging line PCL via the connection transistor TG22b and the pass transistor Pass-TR.

The connection transistors TG11a and TG21a are controlled by the connection control line TL1a, the connection transistors TG11b and TG21b are controlled by the connection control line TL1b, the connection transistors TG12a and TG22a are controlled by the connection control line TL2a, and the connection transistors TG12b and TG22b are controlled by the connection control line TL2b.

In the pass transistor pass-TR connected in series to each connection transistor, an N-type impurity layer such as phosphorus is formed in the channel portion. The transistor is always in the ON state irrespective of the voltage to be supplied to the connection control line.

The sub bit line SBL1a is connected to the NAND strings NAND11a and NAND12a, the sub bit line SBL1b is connected to the NAND strings NAND11b and NAND12b, the sub bit line SBL2a is connected to the NAND strings NAND21a and NAND22a, and the sub bit line SBL2b is connected to the NAND strings NAND21b and NAND22b.

Each NAND string is constituted by two serially connected selection transistors ST1 and ST2 and four memory transistors MT1 to MT4.

In the NAND strings NAND1a, NAND11b, NAND21a, and NAND21b, the selection transistor ST1 is controlled by the selection gate line SL11, the selection transistor ST2 is controlled by the selection gate line SL12, and the memory transistors NT1 to MT4 are respectively controlled by the word lines WL11 to WL14.

Further, in the NAND strings NAND12a, NAND12b, NAND22a, and NAND22b, the selection transistor ST1 is controlled by the selection gate fine SL21, the selection transistor ST2 is controlled by the selection gate line SL22, and the memory transistors MT1 to MT4 are respectively controlled by the word lines WL21 to WL24.

Note that in the configuration of FIG. 13, for convenience, four memory transistors are connected in series to one NAND string, but in an actual configuration, the number of memory transistors to be connected in series to one NAND string is about 16.

Figure 15:
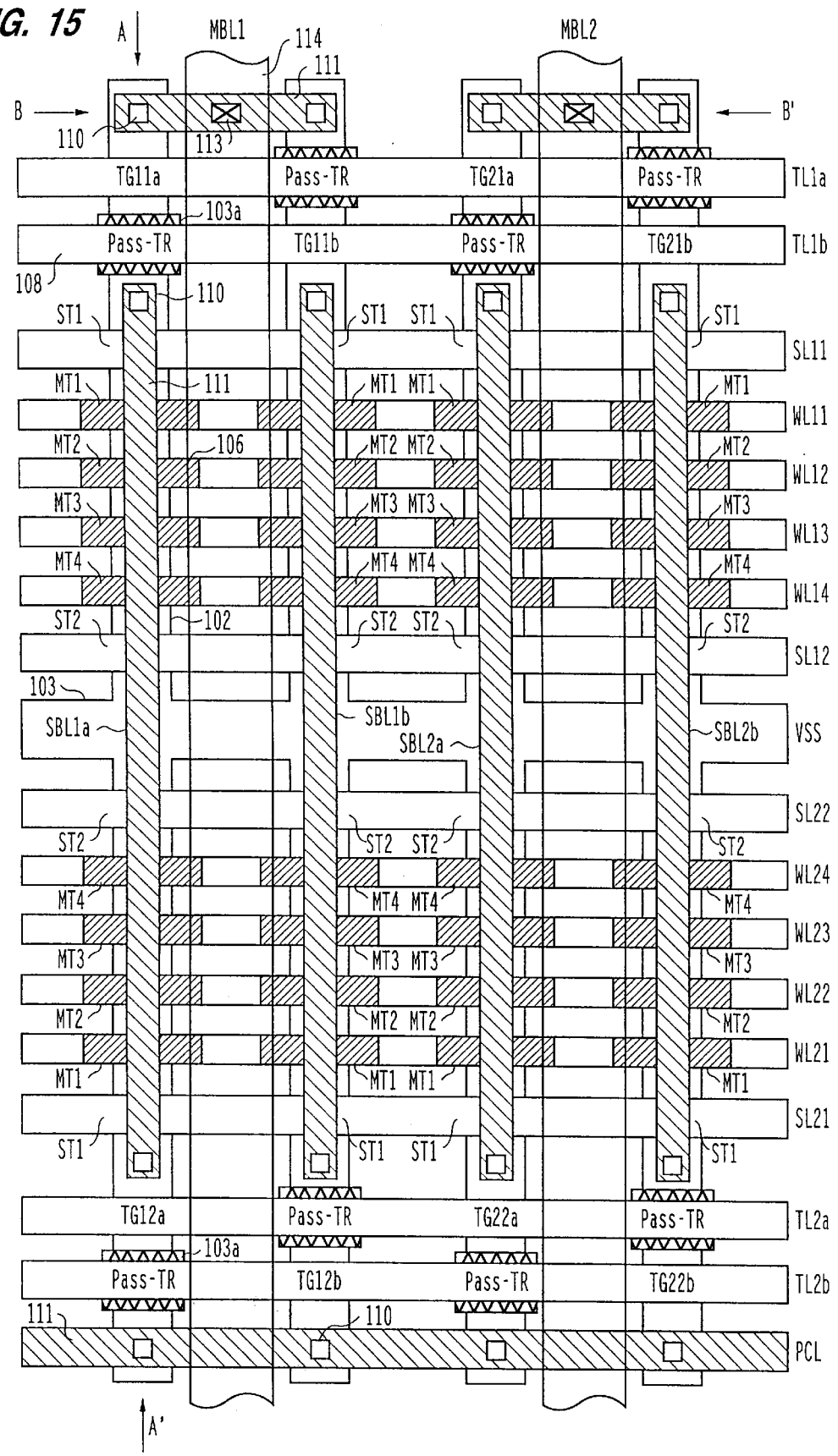
FIG. 15 is a view of the pattern layout of FIG. 14.

FIG. 15 is a view of the pattern layout of the NAND type semiconductor nonvolatile memory device of FIG. 14.

Figure 16A:
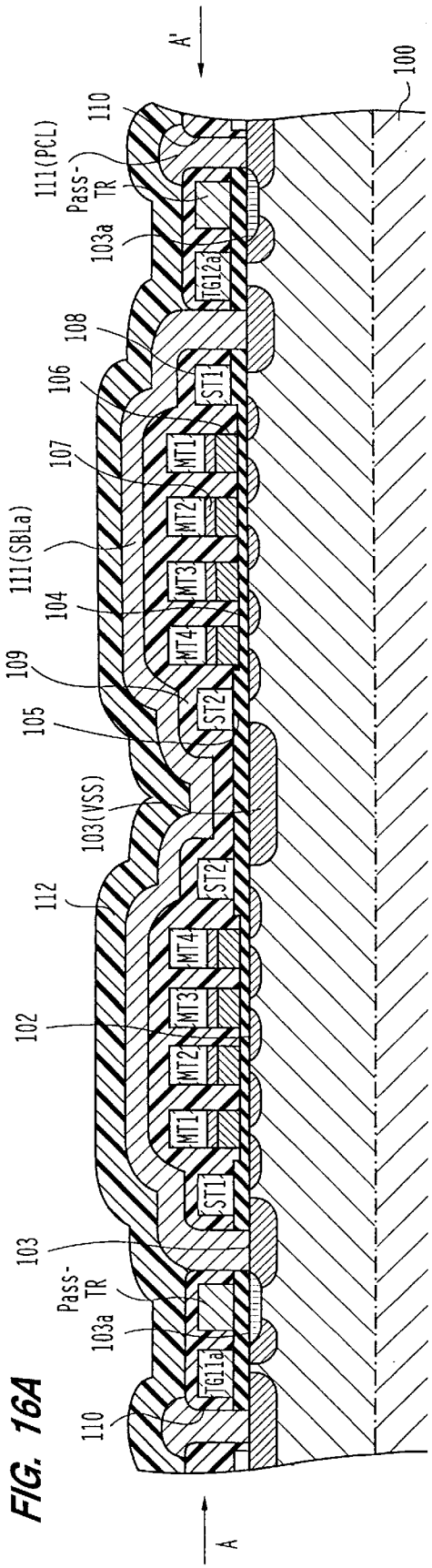
FIG. 16 consisting of FIGS. 16A through 16B is a sectional view of the device structure in the pattern layout of FIG. 15.
Figure 16B:
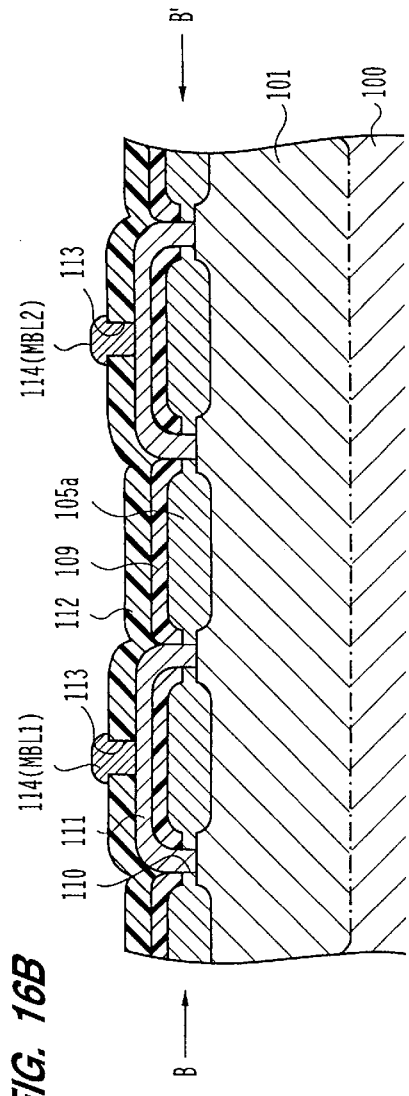

Further, FIGS. 16A and 16B are sectional views of device structure, in which FIG. 16A is a sectional view in a direction A-A' in FIG. 15, and FIG. 16B is a sectional view in a direction B-B'.

In FIG. 15 and FIGS. 16A and 16B, 100 denotes a semiconductor substrate, 101 denotes a P-type well region in which a memory array region is formed, 102 denotes a source and drain N-type diffusion layer of a memory transistor, 103 denotes a VSS interconnection and an N-type diffusion layer of a bit contact portion, 103a denotes an N-type diffusion layer formed in the channel portion of the pass transistor, 104 denotes a tunnel oxide film, 105 denotes a gate oxide film of the selection transistor portion, 105a denotes a LOCOS element isolation oxide film, 106 denotes a first layer polycrystalline silicon gate electrode forming a floating gate electrode, 107 denotes an ONO-3 layer insulation film, 108 denotes second layer polycrystalline silicon interconnections forming control gate electrodes of the memory transistors and selection transistors, 109 denotes an inter-layer insulation film under the third layer polycrystalline silicon interconnections, 110 denotes a contact hole under the third layer polycrystalline silicon interconnections, 111 denotes third layer polycrystalline silicon interconnections forming the sub bit lines and precharging lines, 112 denotes an inter-layer insulation film under the aluminum interconnections, 113 denotes a contact hole under the aluminum interconnections, and 114 denotes aluminum interconnections forming the main bit lines.

Next, an explanation will be made of a data programming operation in the NAND type semiconductor nonvolatile memory device of FIG. 13 and FIG. 14 in relation to FIG. 17.

Figure 17:
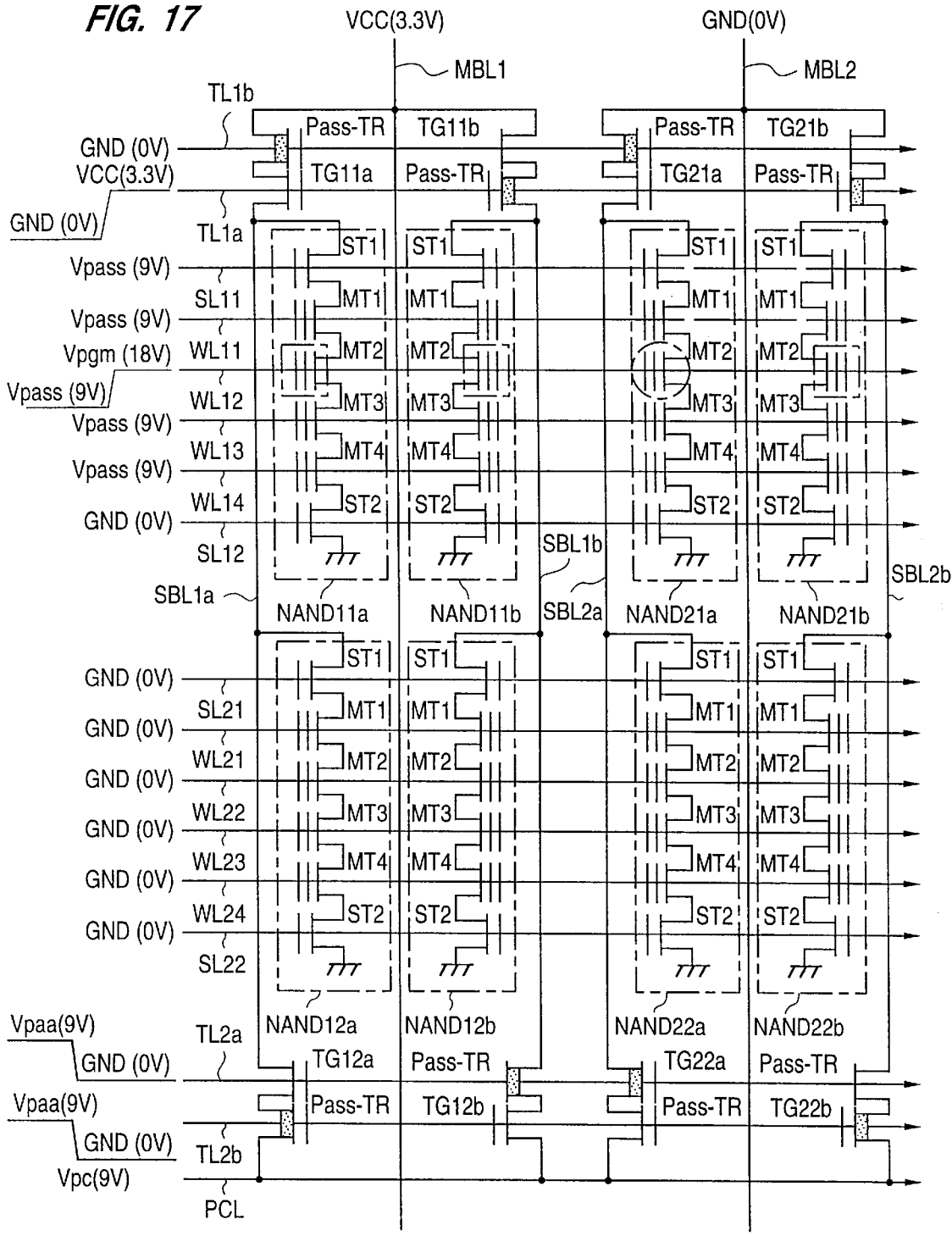
FIG. 17 is a view for explaining a data programming operation in the NAND type semiconductor nonvolatile memory device of the third embodiment.

FIG. 17 is a view for explaining an operation where MT2 in the NAND string NAND11a is a memory transistor for which programming is prohibited and where MT2 in the NAND string NAND21a is a memory transistor which is to be programmed when page programming is carried out by selecting the word line WL12, selecting the sub bit lines SBL1a and SBL2a, and not selecting the sub bit lines SBL1b and SBL2b.

In this case, among the memory transistors connected to the word line WL12, only the memory transistor MT2 in the NAND string NAND21a is to be programmed in data. The data programming must be prohibited in all of the memory transistors MT2 in the other NAND strings NAND11a, NAND11b, and NAND 21b.

First, in a state where the ground voltage GND (0 V) is supplied to the connection control lines TL1a and TL1b, and the sub bit lines SBL1a, SBL1b, SBL2a, and SBL2b are isolated from the corresponding main bit lines MBL1 and MBL2, the pass voltage Vpass (9 V) is supplied to the connection control lines TL2a and TL2b. By this, the sub bit lines SBL1a, SBL1b, SBL2a, and SBL2b are all charged from the precharging line PCL to the precharging voltage (9 V) prohibiting the programming.

Simultaneously, the ground voltage GND (0 V) is supplied to the selection gate line SL12, and the pass voltage Vpass (9 V) is supplied to the selection gate lines SL11 and the word lines WL11 to WL14. By this, the channel portions of the NAND strings NAND11a, NAND11b, NAND21a, and NAND21b are all charged up to the programming prohibit voltage (9 V) via the sub bit lines.

At this time, in the non-selected NAND strings NAND12a, NAND12b, NAND22a, and NAND22b, the ground voltage GND (0 V) is supplied to the selection gate lines SL21 and SL22 and the word lines WL21 to WL24, therefore the NAND strings are isolated from the sub bit lines and voltage is not supplied to the memory transistors.

Next, in a state where the connection control lines TL2a and TL2b fall to the ground voltage GND (0 V) and the sub bit lines SBL1a, SBL1b, SBL2a, and SBL2b are all isolated from the precharglng line PCL, the connection control line TL1a is raised to the power supply voltage VCC (3.3 V), and the sub bit lines SBL1a and SBL2a are connected to the main bit lines MBL1 and MBL2.

Here, the main bit line MBL1 to which the memory transistors for which programming is prohibited (MT2 in the NAND11a) are connected is set to the power supply voltage VCC (3.3 V), while the main bit line MBL2 to which the memory transistor which are to be programmed (MT2 in the NAND21a) is connected is set to the ground voltage GND (0 V) via respectively corresponding data latch circuits.

As a result, the channel portions of the NAND strings NAND11a, NAND11b, and NAND21b and corresponding sub bit lines are held at the programming prohibit potential while holding the floating state, but the programming prohibit potential of the channel portion of the NAND string NAND21a and the sub bit line SBL2a is discharged to the main bit line MBL2.

Simultaneously, the voltage supplied to the selected word line WL12 is raised to the programming voltage Vpgm (18 V).

As a result, the memory transistors MT2 in the NAND strings NAND11a, NAND11b, and NAND21b are held in the erasing state by the programming prohibit voltage, the data is programmed only in the memory transistor MT2 in the NAND string NAND21a by the program voltage Vpgm, and the threshold voltage shifts in the positive direction and becomes for example −3 V to about 2 V of the erasing state.

Not only is the embodiment of FIG. 17 explained above suited to low voltage operation since the charging capacity can be greatly reduced in comparison with the system of the related art of charging the potential of the non-selected NAND string channel portion up to the programming prohibit potential via the main bit line, but also the layout of the bit contacts between the aluminum interconnections and the diffusion layer and the data latch circuits becomes easy since the pitch of the main bit lines in the column direction can be further increased.

Further, it is possible to set the programming prohibit potential to a sufficiently high voltage (about 9 V) in comparison with the self-boost operation of the related art for raising the potential of the NAND string channel portion by capacity coupling of the voltage supplied to the word lines.

Accordingly, the disturb tolerance with respect to the non-selected memory transistors can be improved.

FIGS. 18A to 18I are timing charts of the operation explained in relation to FIG. 17 explained above.

Below, the data programming operation of FIG. 17 will be explained in further detail by referring to the timing charts of FIGS. 18A to 18I.

First, ØP/R shown in FIG. 18A is the program/verify control signal, the first programming/verifying operation is carried out in the period from the time t1 to t4 in the figure, and the second programming/verifying operation is carried out in the period from time t4 to t7.

First, the first programming operation is commenced at the time t1. As shown in FIGS. 18B and 18E, the ground voltage GND (0 V) is supplied to the connection control lines TL1a and TL1b and the selection gate line SL12, and as shown in FIGS. 18C, 18D and 18F, the pass voltage Vpass (9 V) is supplied to the connection control lines TL2a and TL2b, the selection gate line SL11, and all of the word lines WL.

As a result, as shown in FIG. 18H, the channel portion potential VCH11a of the NAND string NAND11a, the channel portion potential VCH11b of the NAND string NAND11b, the channel portion potential VCH21a of the NAND string NAND21a, and the channel portion potential VCH21b of the NAND string NAND21b are all charged up to the programming prohibit voltage Vpc (9 V) via corresponding sub bit lines and the precharging line.

Next, as shown in FIGS. 18B and 18C, at the time t2, the connection control lines TL2a and TL2b fall to the ground voltage GND (0 V), and the connection control line TL1a is raised to the power supply voltage VCC (3.3 V).

As a result, the channel portion potentials VCH11a, VCH11b, and VCH21b at which the memory transistors for which programming is prohibited keep the programming prohibit potential while holding the floating state, but the programming prohibit potential of VCH21a at which a memory transistor which is to be programmed is discharged to the main bit line and becomes the GND (0 V).

On the other hand, as shown in FIG. 18F, the program voltage Vpgm (18 V) is supplied to the selected word line. During the period from the time t2 to t3, page programming is carried out together for the memory transistors connected to the word line.

Next, the period from the time t3 to t4 is the first verifying operation period. As shown in FIGS. 18D and 18F, the ground voltage GND is supplied to the connection control lines TL1b and TL2b and the selected word line WL, as shown in FIGS. 18B, 18G, and 18E, the power supply voltage VCC is supplied to the connection control line TL1a, all of the non-selected word lines, and the selection gate lines SL11 and SL12, and a verifying operation similar to that of the usual NAND type flash memory is carried out on only the one selected sub bit line in the pass state.

Further, the period from the time t4 to t7 is the second programming/verifying operation period. This is an exact repetition of the first programming/verifying operation.

FIG. 19 is a view of the setting of the biases for the programming operation, the erasing operation, and the reading operation already explained in the NAND type semiconductor nonvolatile memory device of the first embodiment of the present invention of FIG. 13 to FIG. 18.

Note that, in the figure, the programming operation is shown divided into the operation at the time of precharging (times t1 to t2 in FIG. 18) and operation at the time of the real programming (times t2 to t3 in FIG. 18) for convenience. In FIG. 19, the programming operation is as already explained. A second explanation will be omitted.

The erasing operation is basically the same as that of the NAND type flash memory of the related art. 0 V is supplied to all word lines of the selected NAND string block, and a high voltage (Verase=22 V) is supplied to all word lines of the non-selected NAND string blocks and the substrate PWELL of the memory array.

As a result, electrons are pulled out of the floating gate of only the memory transistors of the selected NAND string block to the substrate, and the threshold voltage of the memory transistor shifts in the negative direction and becomes for example about −3 V.

Also the reading operation is basically the same as that of the NAND type flash memory of the related art. In the selected NAND string block, the ground voltage GND is supplied to the selected word line, and the power supply voltage VCC is supplied to all non-selected word lines, the selected gate line SL, and the selected connection control line TL1. A reading operation similar to that of the usual NAND type flash memory is carried out in the pass state.

As explained above, the NAND type semiconductor nonvolatile memory device of the present third embodiment is configured with a memory array in which main bit lines are divided into pairs of first groups of sub bit lines and second groups of sub bit lines arranged in the column direction and page programming is selectively carried out with respect to the NAND string charged from the selected sub bit line while holding the programming prohibit potential of the NAND string channel portion charged from the non-selected sub bit lines.

Accordingly, not only is the memory suited to a low voltage operation since the charging capacity can be greatly reduced in comparison with the system of the related art of charging the potential of the non-selected NAND string channel portion up to the programming prohibit potential via the main bit line, but also the layout of the bit contacts between the aluminum interconnections and the diffusion layer and the data latch circuits becomes easy since the pitch of the main bit lines in the column direction can be further increased.

Further, it is possible to set the programming prohibit potential to a sufficiently high voltage in comparison with the self-boost operation of the related art of raising the potential of the NAND string channel portion by capacity coupling of the voltage supplied to the word lines.

For this reason, the disturb tolerance at the time of data programming can be improved.

Fourth Embodiment

Figure 20:
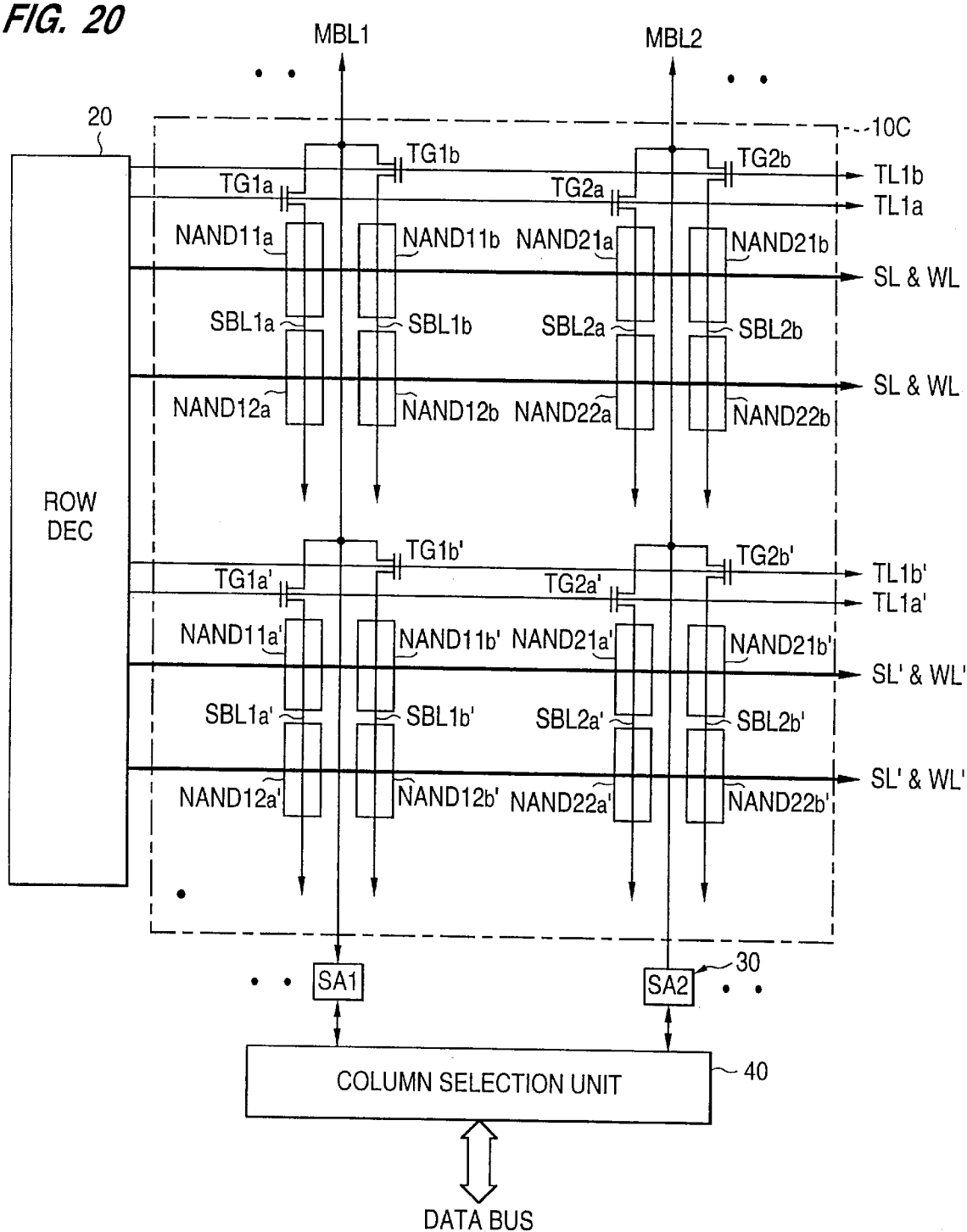
FIG. 20 is a view of the example of the configuration of a NAND type semiconductor nonvolatile memory device according to a fourth embodiment of the present invention.

FIG. 20 is a view of an example of the configuration of a NAND type semiconductor nonvolatile memory device according to a fourth embodiment of the present invention.

The NAND type semiconductor nonvolatile memory device of FIG. 20 is constituted by a memory array 10C, a row decoder 20, a group of data latch circuits 30, and a column selection unit 40.

The NAND type semiconductor nonvolatile memory device of FIG. 20 is for convenience shown as a memory array comprising two main bit lines, a pair of groups of sub bit lines divided for every main bit line, two sub bit lines constituting each group of sub bit lines, and two NAND strings connected for every sub bit line, but in an actual memory array, in the case of a memory of for example 64 Mbits, there are 256 bytes (about 2k) worth of the main bit lines, 16 sub bit lines constituting each group of sub bit lines, 64 NAND strings connected for every sub bit line, and about 16 memory transistors connected in series to each NAND string.

In the memory array 10c. MBL1 and MBL2 denote main bit lines, the main bit line MBL1 is divided into the pairs of sub bit lines SBL1a, SBL1a' and SBL1b, SBL1b', and the main bit line MBL2 is divided into the pairs of sub bit lines SBL2a, SBL2a' and SBL2b, SB2b'.

The sub bit line SBL1a is connected to the main bit line MBL1 via the connection transistor TG1a.

The sub bit line SBL1a' is connected to the main bit line MBL1 via the connection transistor TG1a'.

The sub bit line SBL1b is connected to the main bit line MBL1 via the connection transistor TG1b.

The sub bit line SBL1b' is connected to the main bit line MBL1 via the connection transistor TG1b'.

The sub bit line SBL2a is connected to the main bit line MBL2 via the connection transistor TG2a.

The sub bit line SBL2a' is connected to the main bit line MBL2 via the connection transistor TG2a'.

The sub bit line SBL2b is connected to the main bit line MBL2 via the connection transistor TG2b.

The sub bit line SBL2b' is connected to the main bit line MBL2 via the connection transistor TG2b'.

The connection transistors TG1a and TG2a are controlled by the connection control line TL1a, the connection transistors TG1b and TG2b are controlled by the connection control line TL1b, the connection transistors TG1a' and TG2a' are controlled by the connection control line TL1a', and the connection transistors TG1b' and TG2b' are controlled by the connection control line TL1b'.

The sub bit line SBL1a is connected to the NAND strings NAND11a and NAND12a, the sub bit line SBL1b is connected to the NAND strings NAND11b and NAND12b, the sub bit line SBL2a is connected to the NAND strings NAND21a and NAND22a, the sub bit line SBL2b is connected to the NAND strings NAND21b and NAND22b, the sub bit line SBL1a' is connected to the NAND strings NAND11a' and NAND12a', the sub bit line SBL1b' is connected to the NAND strings NAND11b' and NAND12b', the sub bit line SBL2a' is connected to the NAND strings NAND21a' and NAND22a', and the sub bit line SBL2b' is connected to the NAND strings NAND21b' and NAND22b'.

Each NAND string is constituted by serially connected selection transistors and memory transistors and is controlled by selection gate lines SL (SL') and word lines WL (WL').

The main bit line MBL1 is connected to a data latch circuit SA1, and the main bit line MBL2 is connected to a data latch circuit SA2.

Figure 21:
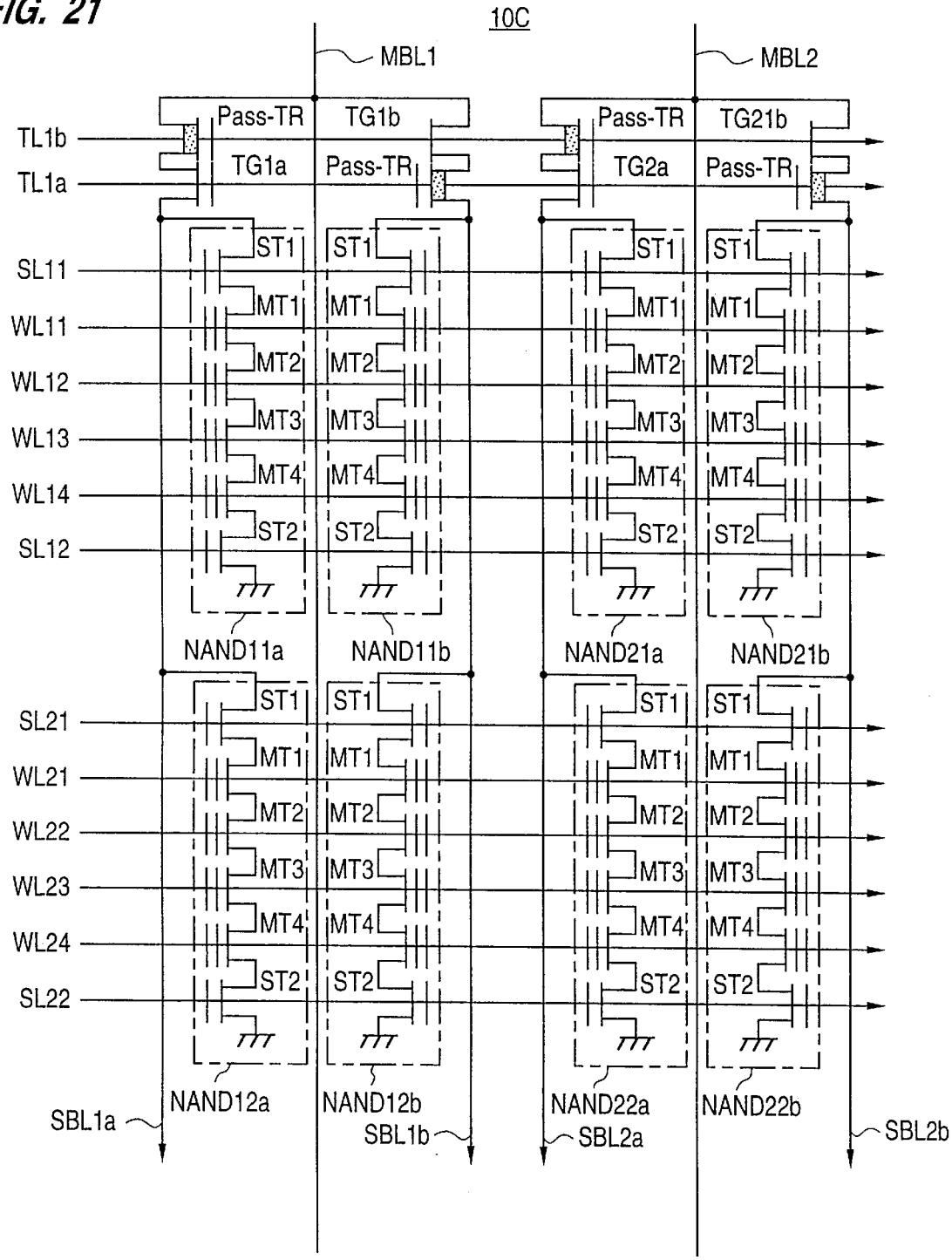
FIG. 21 is a view of the detailed configuration of the memory array in FIG. 20.

FIG. 21 is a view of the detailed configuration of the memory array 10C in the NAND type semiconductor nonvolatile memory device of FIG. 20. Only two main bit lines and one sub bit line are illustrated for every main bit line for convenience.

In FIG. 21, the main bit line MBL1 is divided into a pair of sub bit lines SBL1a and SBL1b, while the main bit line MBL2 is divided into a pair of sub bit lines SBL2a and SBL2b.

The sub bit line SBL1a is connected to the main bit line MBL1 via the connection transistor TG1a and the pass transistor pass-TR.

The sub bit line SBL1b is connected to the main bit line MBL1 via the connection transistor TG1b and the pass transistor pass-TR.

The sub bit line SBL2a is connected to the main bit line MBL2 via the connection transistor TG2a and the pass transistor pass-TR.

The sub bit line SBL2b is connected to the main bit line MBL2 via the connection transistor TG2b and the pass transistor pass-TR.

The connection transistors TG1a and TG2a are controlled by the connection control line TL1a, while the connection transistors TG1b and TG2b are controlled by the connection control line TL1b.

In the pass transistor pass-TR connected in series to each connection transistor, an N-type impurity layer such as phosphorus is formed in the channel portion. The transistor is always in the ON state irrespective of the voltage to be supplied to the connection control line.

Accordingly, in the memory array of FIG. 21, when the connection control line TL1a is at a high level and the connection control line TL1b is at a low level, the sub bit line SBL1a is connected to the main bit line MBL1 and the sub bit line SBL2a is connected to the main bit line MBL2.

Further, when the connection control line TL1b is at the high level and the connection control line TL1a is at the low level, the sub bit line SBL1b is connected to the main bit line MBL1 and the sub bit line SBL2b is connected to the main bit line MBL2.

The sub bit line SBL1a is connected to the NAND strings NAND11a and NAND12a, the sub bit line SBL1b is connected to the NAND strings NAND11b and NAND12b, the sub bit line SBL2a is connected to the NAND strings NAND21a and NAND22a, and the sub bit line SBL2b is connected to the NAND strings NAND21b and NAND22b.

Each NAND string is constituted by two serially connected selection transistors ST1 and ST2 and four memory transistors MT1 to MT4.

In the NAND strings NAND11a, NAND11b, NAND21a, and NAND21b, the selection transistor ST1 is controlled by the selection gate line SL11, the selection transistor ST2 is controlled by the selection gate line SL12, and the memory transistors MT1 to MT4 are respectively controlled by the word lines WL11 to WL14.

In the NAND strings NAND12a, NAND12b, NAND22a, and NAND22b, the selection transistor ST1 is controlled by the selection gate line SL21, the selection transistor ST2 is controlled by the selection gate line SL22, and the memory transistors MT1 to MT4 are respectively controlled by the word lines WL21 to WL24.

Note that, in the configuration of FIG. 21, for convenience, four memory transistors are connected in series to one NAND string, but in the actual configuration, there are about 16 memory transistors connected in series to one NAND string.

Figure 22:
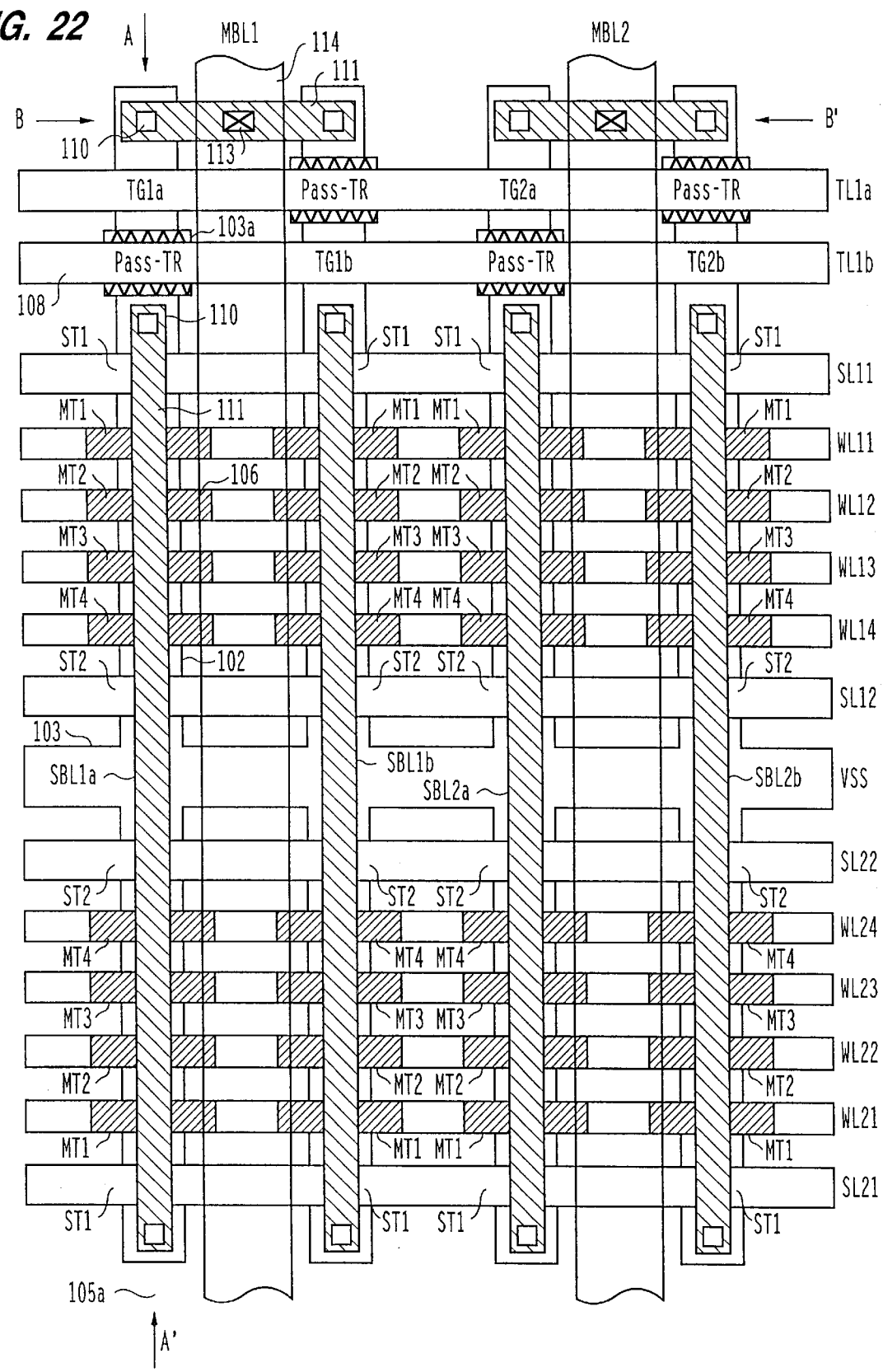
FIG. 22 is a view of the pattern layout of FIG. 21.

FIG. 22 is a view of a pattern layout of the NAND type semiconductor nonvolatile memory device of FIG. 21.

Figure 23A:
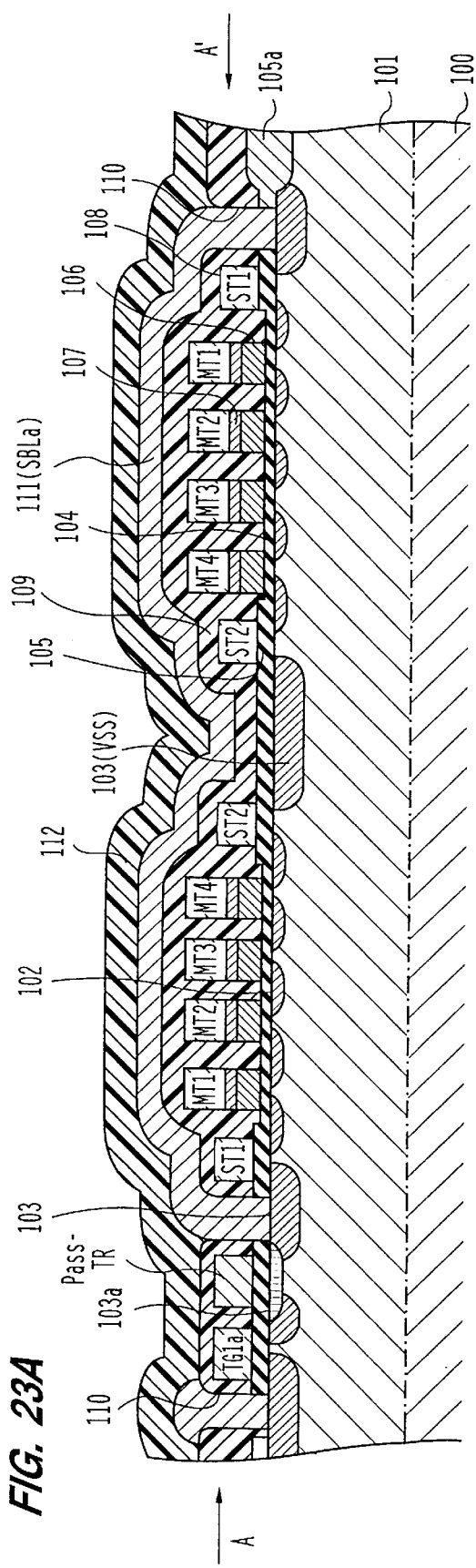
FIG. 23 consisting of FIGS. 23A through 23B is a sectional view of the device structure in the pattern layout of FIG. 22.
Figure 23B:
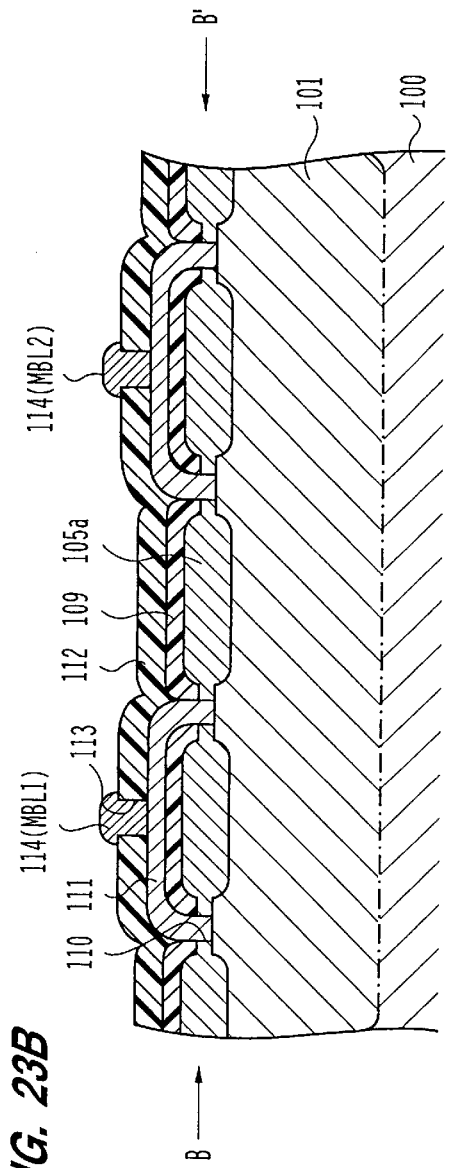

Further, FIGS. 23A and 23B are sectional views of the device structure, in which FIG. 23A is a sectional view in the direction A-A' and FIG. 23B is a sectional view in the direction B-B'.

In FIG. 22 and FIGS. 23A and 23B, 100 denotes a semiconductor substrate, 101 denotes a P-type well region in which a memory array region is formed, 102 denotes a source and drain N-type diffusion layer of a memory transistor, 103 denotes a VSS interconnection and an N-type diffusion layer of a bit contact portion, 103a denotes an N-type diffusion layer formed in the channel portion of the pass transistor, 104 denotes a tunnel oxide film, 105 denotes a gate oxide film of the selection transistor portion, 105a denotes a LOCOS element isolation oxide film, 106 denotes a first layer polycrystalline silicon gate electrode forming a floating gate electrode, 107 denotes an ONO-3 layer insulation film, 108 denotes second layer polycrystalline silicon interconnections forming control gate electrodes of the memory transistors and selection transistors, 109 denotes an inter-layer insulation film under the third layer polycrystalline silicon interconnections, 110 denotes a contact hole under the third layer polycrystalline silicon interconnections, 111 denotes a third layer polycrystalline silicon interconnection forming the sub bit lines, 112 denotes an inter-layer insulation film under the aluminum interconnections, 113 denotes a contact hole under the aluminum interconnections, and 114 denotes aluminum interconnections forming the main bit lines.

In the pattern layout of FIG. 22, the pitch of the bit contact (110) between the third layer polycrystalline silicon interconnections (111) forming the sub bit lines and the sub bit lines in the column direction is not increased in comparison with the bit line pitch of the related art. However, detailed work in the process of formation of polycrystalline silicon interconnections and contacts is easier than detailed work in the process of formation of aluminum interconnections and contacts, therefore this is more advantageous for shrinking of the cell size than the bit line configuration of the related art.

As explained above, the NAND type semiconductor nonvolatile memory device of the fourth embodiment is configured as a memory array in which main bit lines are divided into a plurality of groups of sub bit lines in the column direction.

Accordingly, the pitch of the main bit lines in the column direction can be increased, therefore the layout of the bit contacts between the aluminum interconnections and the diffusion layer and the data latch circuits becomes easy.

Fifth Embodiment

Figure 24:
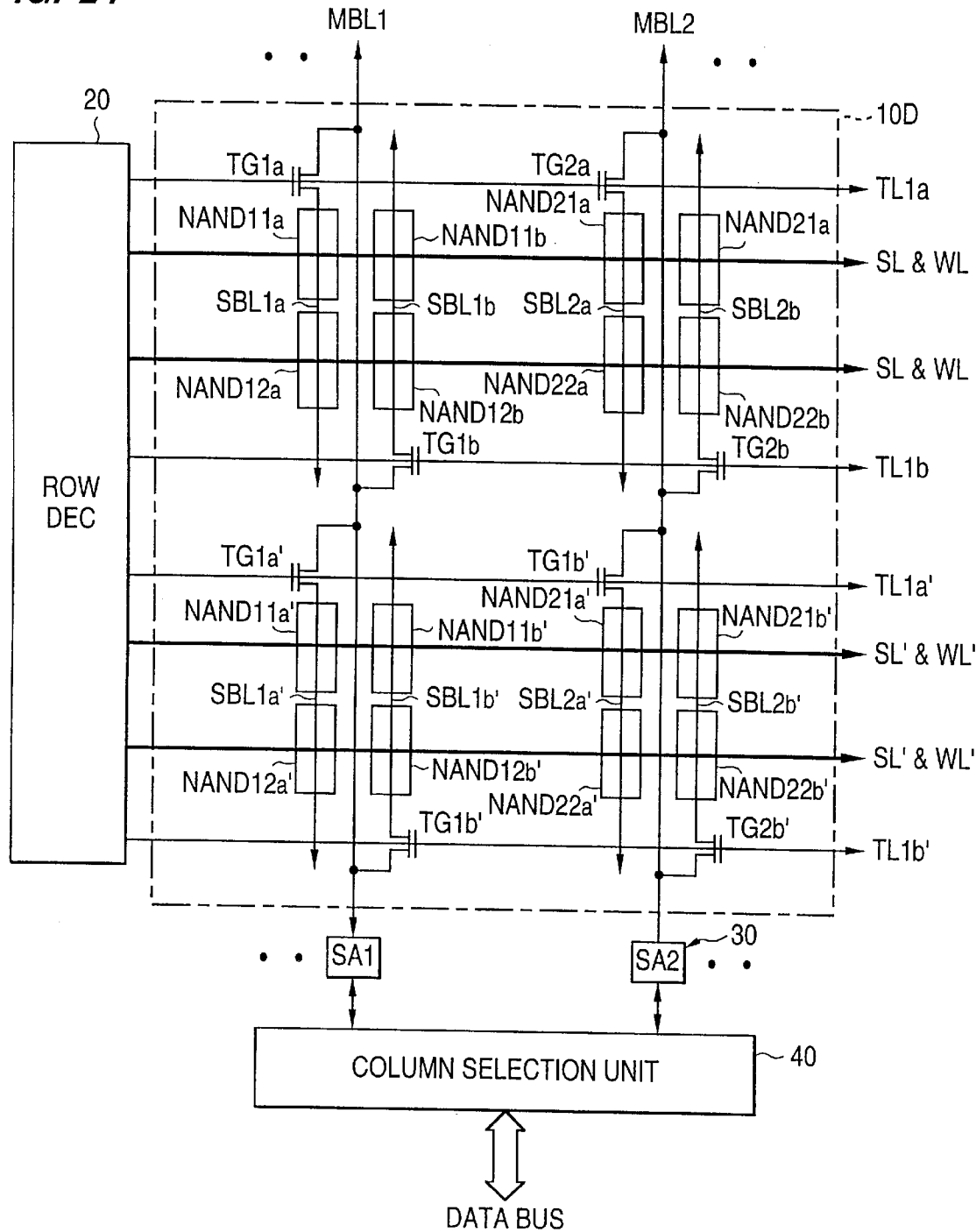
FIG. 24 is a view of the example of the configuration of a NAND type semiconductor nonvolatile memory device according to a fifth embodiment of the present invention.

FIG. 24 is a view of an example of the configuration of a NAND type semiconductor nonvolatile memory device according to a fifth embodiment of the present invention.

The difference of the example of the configuration of the fifth embodiment of FIG. 24 from the example of the configuration of the fourth embodiment of FIG. 20 resides in that a memory array structure is exhibited in which pairs of sub bit lines arranged in the column direction are connected to the main bit lines via the connection transistors on ends opposite to each other.

Accordingly, the pass transistor pass-TR which was necessary in the fourth embodiment becomes unnecessary and the processing steps (N-type diffusion layer of 103a) can be reduced.

The NAND type semiconductor nonvolatile memory device of FIG. 24 is constituted by a memory array 10D, a row decoder 20, a group of data latch circuits 30, and a column selection unit 40.

The NAND type semiconductor nonvolatile memory device of FIG. 24 is shown for convenience as a memory array comprising two main bit lines, a pair of groups of sub bit lines divided for every main bit line, two sub bit lines constituting each group of sub bit lines, and two NAND strings connected for every sub bit line, but in an actual memory array, in the case of a memory of for example 64 M bits, there are 256 bytes (about 2k) worth the main bit lines, 16 sub bit lines constituting each group of sub bit lines, 64 NAND strings connected for every sub bit line, and about 16 memory transistors connected in series to each NAND string.

In the memory array 10D, MBL1 and MBL2 denote main bit lines, the main bit line MBL1 is divided into the pairs of sub bit lines SBL1a, SBL1a' and SBL1b, SBL1b', and the main bit line MBL2 is divided into the pairs of sub bit lines SBL2a, SBL2a' and SBL2b, SB2b'.

The sub bit line SBL1a is connected to the main bit line MBL1 via the connection transistor TG1a.

The sub bit line SBL1a' is connected to the main bit line MBL1 via the connection transistor TG1a'.

The sub bit line SBL1b is connected to the main bit line MBL1 via the connection transistor TG1b.

The sub bit line SBL1b' is connected to the main bit line MBL1 via the connection transistor TG1b'.

The sub bit line SBL2a is connected to the main bit line MBL2 via the connection transistor TG2a.

The sub bit line SBL2a' is connected to the main bit line MBL2 via the connection transistor TG2a'.

The sub bit line SBL2b is connected to the main bit line MBL2 via the connection transistor TG2b.

The sub bit line SBL2b' is connected to the main bit line MBL2 via the connection transistor TG2b'.

The connection transistors TG1a and TG2a are controlled by the connection control line TL1a, the connection transistors TG1b and TG2b are controlled by the connection control line TL1b, the connection transistors TG1a' and TG2a' are controlled by the connection control line TL1a', and the connection transistors TG1b' and TG2b' are controlled by the connection control line TL1b'.

The sub bit line SBL1a is connected to the NAND strings NAND11a and NAND12a, the sub bit line SBL1b is connected to the NAND strings NAND11b and NAND12b, the sub bit line SBL2a is connected to the NAND strings NAND21a and NAND22a, the sub bit line SBL2b is connected to the NAND strings NAND21b and NAND22b, the sub bit line SBL1a' is connected to the NAND strings NAND11a' and NAND12a', the sub bit line SBL1b' is connected to the NAND strings NAND11b' and NAND12b', the sub bit line SBL2a' is connected to the NAND strings NAND21a' and NAND22a', and the sub bit line SBL2b' is connected to the NAND strings NAND21b' and NAND22b'.

Each NAND string is constituted by serially connected selection transistors and memory transistors and controlled by selection gate lines SL (SL') and word lines WL (WL').

The main bit line MBL1 is connected to a data latch circuit SA1, and the main bit line MBL2 is connected to a data latch circuit SA2.

Figure 25:
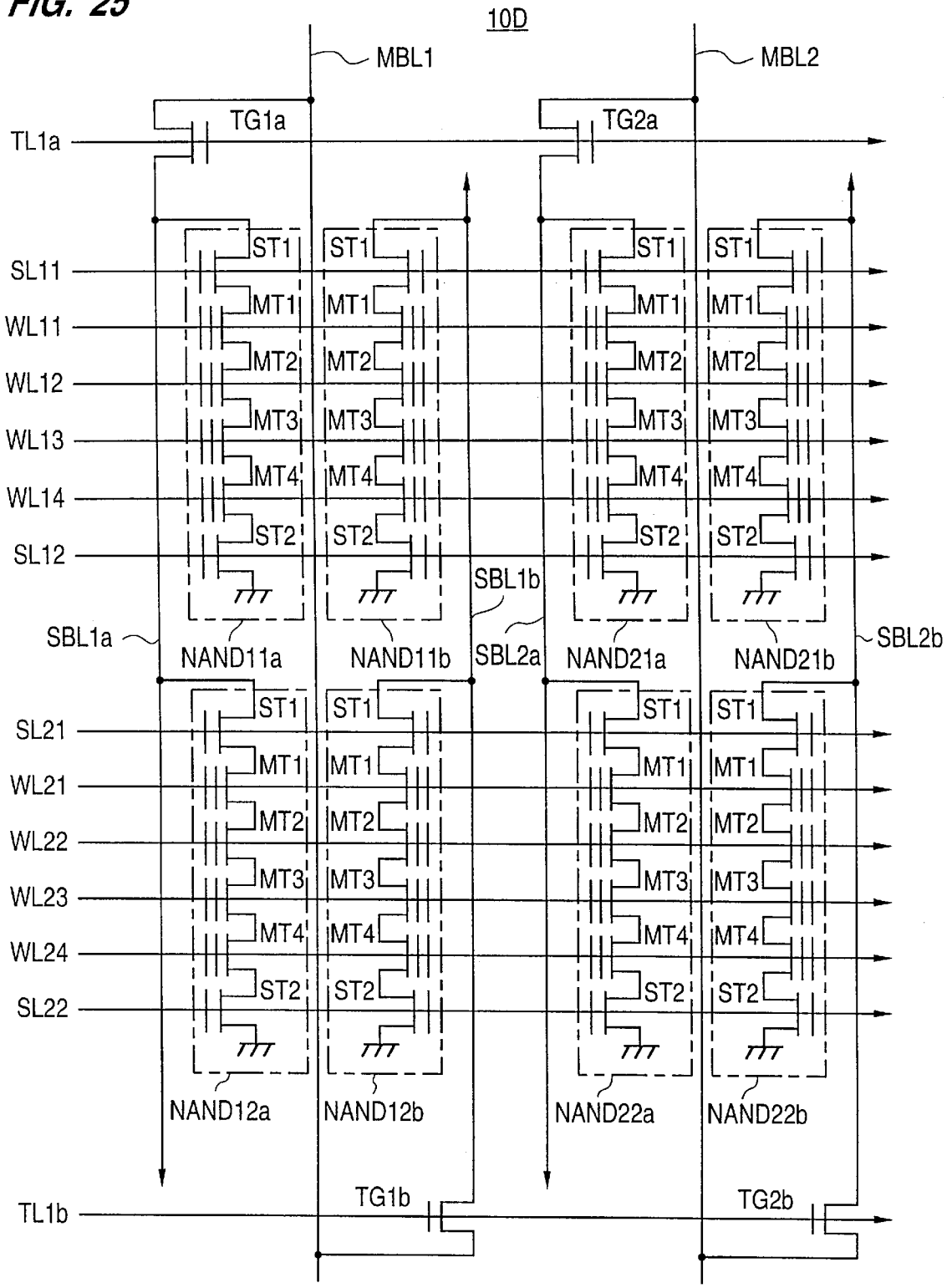
FIG. 25 is a view of the detailed configuration of the memory array in FIG. 24.

FIG. 25 is a view of the detailed configuration of the memory array 10D in the NAND type semiconductor nonvolatile memory device of FIG. 24. Only two main bit lines and one sub bit line are illustrated for every main bit line for convenience.

In FIG. 25, the main bit line MBL1 is divided into the pair of sub bit lines SBL1a and SBL1b, and the main bit line MBL2 is divided into the pair of sub bit lines SBL2a and SBL2b.

The sub bit line SBL1a is connected to the main bit line MBL1 via the connection transistor TG1a.

The sub bit line SBL1b is connected to the main bit line MBL1 via the connection transistor TG1b.

The sub bit line SBL2a is connected to the main bit line MBL2 via the connection transistor TG2a.

The sub bit line SBL2b is connected to the main bit line MBL2 via the connection transistor TG2b.

The connection transistors TG1a and TG2a are controlled by the connection control line TL1a, while the connection transistors TG1b and TG2b are controlled by the connection control line TL1b.

In the memory array of FIG. 25, when the connection control line TL1a is at a high level and the connection control line TL1b is at a low level, the sub bit line SBL1a is connected to the main bit line MBL1 and the sub bit line SBL2a is connected to the main bit line MBL2.

Further, when the connection control line TL1b is at a high level and the connection control line TL1a is at a low level, the sub bit line SBL1b is connected to the main bit line MBL1 and the sub bit line SBL2b is connected to the main bit line MBL2.

The sub bit line SBL1a is connected to the NAND strings NAND11a and NAND12a, the sub bit line SBL1b is connected to the NAND strings NAND11b and NAND12b, the sub bit line SBL2a is connected to the NAND strings NAND21a and NAND22a, and the sub bit line SBL2b is connected to the NAND strings NAND21b and NAND22b.

Each NAND string is constituted by two serially connected selection transistors ST1 and ST2 and four memory transistors MT1 to MT4.

In each of the NAND strings NAND1a, NAND11b, NAND21a, and NAND21b, the selection transistor ST1 is controlled by the selection gate line SL11, the selection transistor ST2 is controlled by the selection gate line SL12, and the memory transistors MT1 to MT4 are respectively controlled by the word lines WL11 to WL14.

In each of the NAND strings NAND12a, NAND12b, NAND22a, and NAND22b, the selection transistor ST1 is controlled by the selection gate line SL21, the selection transistor ST2 is controlled by the selection gate line SL22, and the memory transistors MT1 to MT4 are respectively controlled by the word lines WL21 to WL24.

Note that, in the configuration of FIG. 25, for convenience, four memory transistors are connected in series to one NAND string, but in the actual configuration, there are about 16 memory transistors connected in series to one NAND string.

Figure 26:
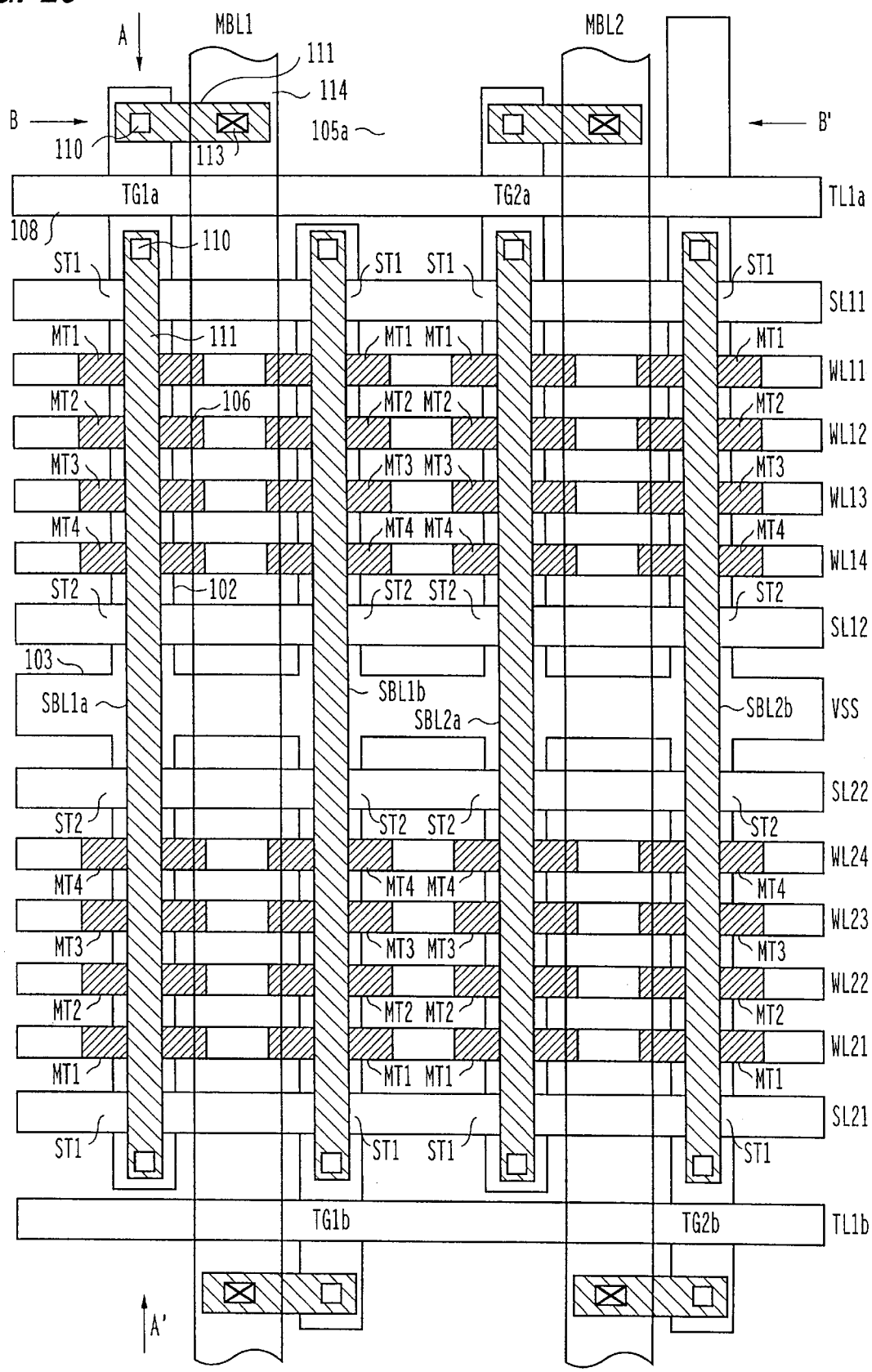
FIG. 26 is a view of the pattern layout of FIG. 25.

FIG. 26 is a view of the pattern layout of the NAND type semiconductor nonvolatile memory device of FIG. 25.

Figure 27A:
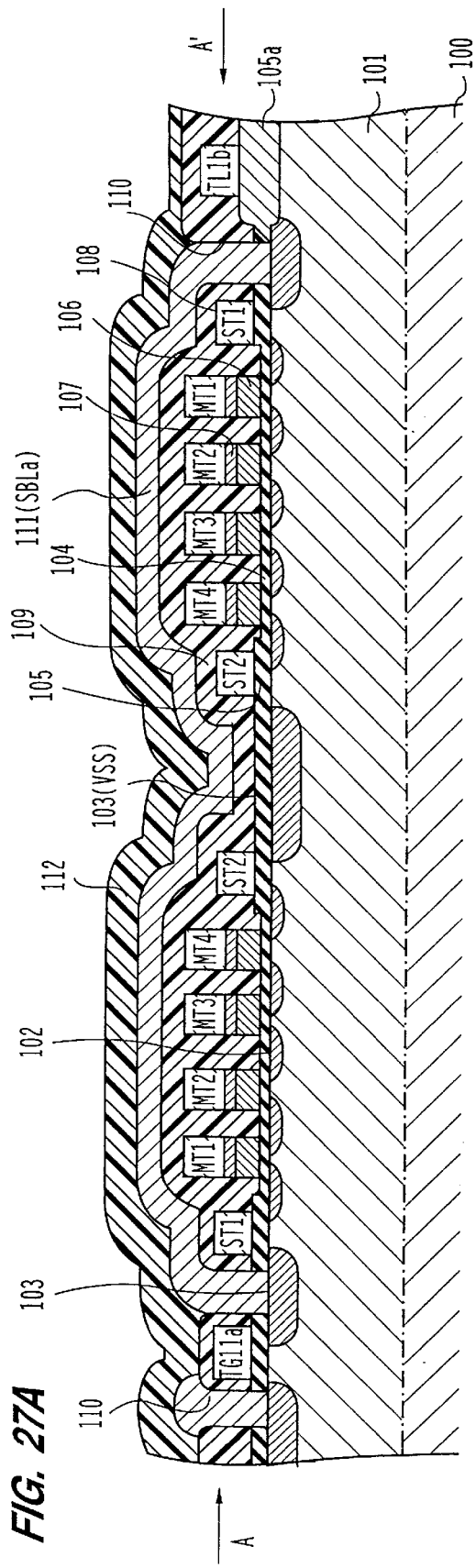
FIG. 27 consisting of FIGS. 27A through 27B is a sectional view of the device structure in the pattern layout of FIG. 26.
Figure 27B:
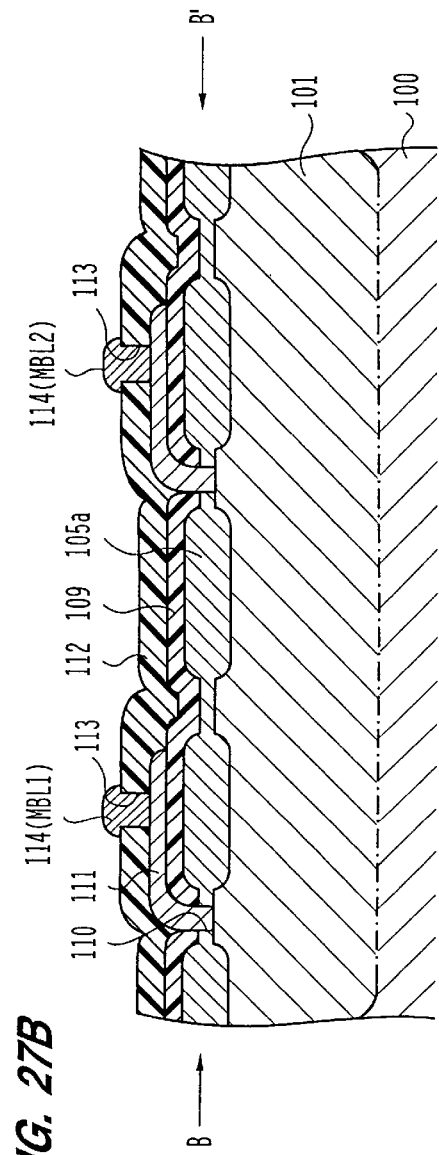
Figure 28:
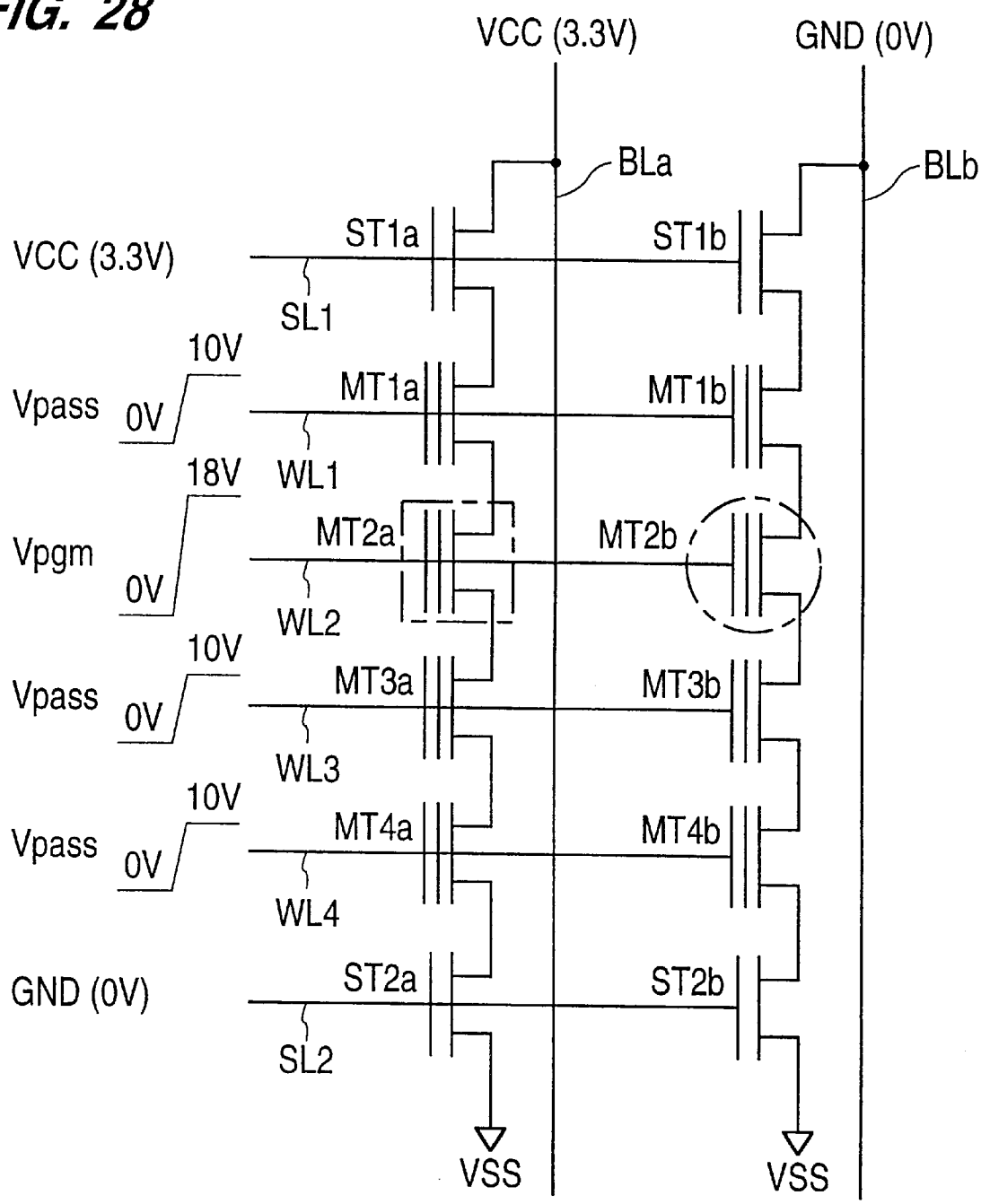
FIG. 28 is a view for explaining a data programming operation using a self-boost operation.
Figure 29B:
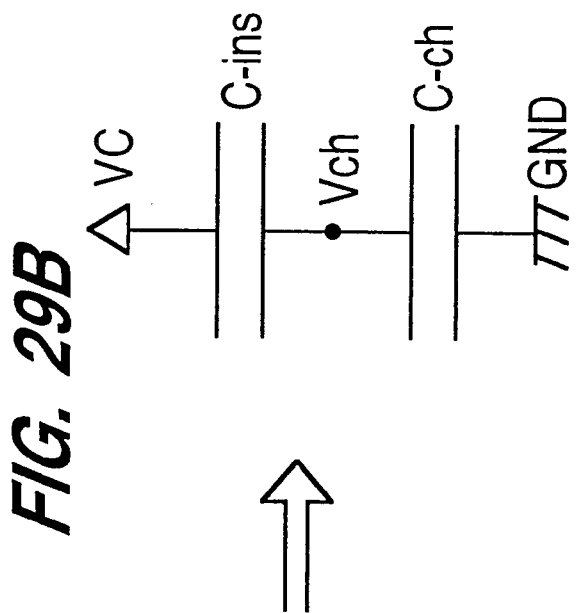
FIG. 29B is an equivalent circuit diagram thereof.
Figure 29A:
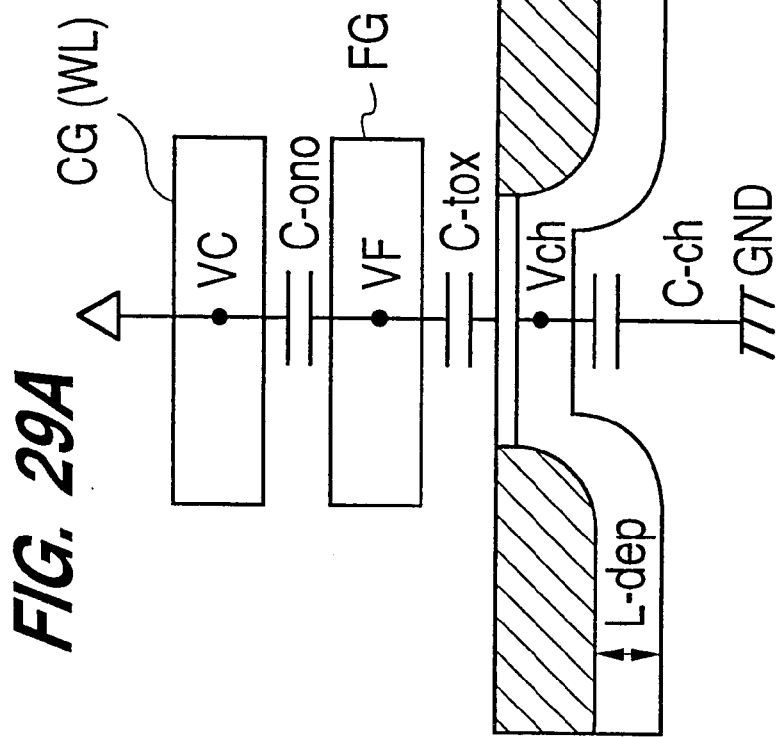
FIG. 29A illustrates a memory transistor at the time of a self-boost operation.
Figure 30A:
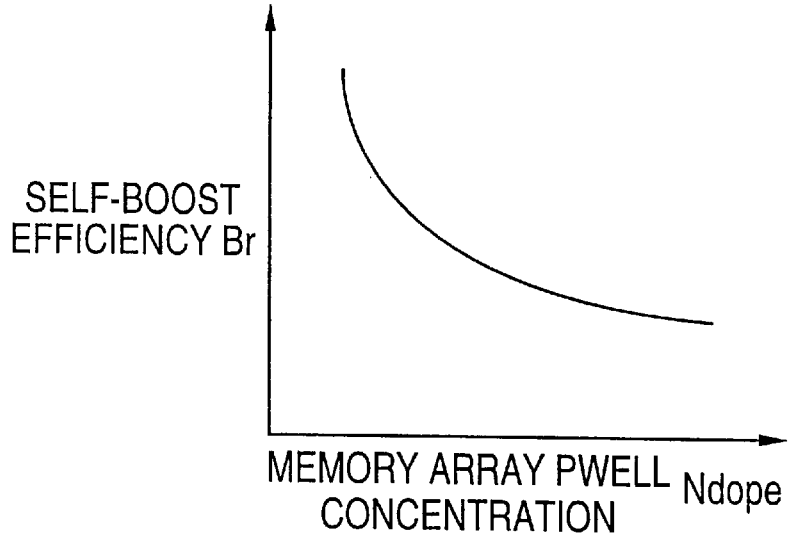
FIG. 30 consisting of 30A through 30B is a view for explaining the fact that there is a tradeoff between securing of the self-boost efficiency Br and the shortening of the channels of transistors.
Figure 30B:
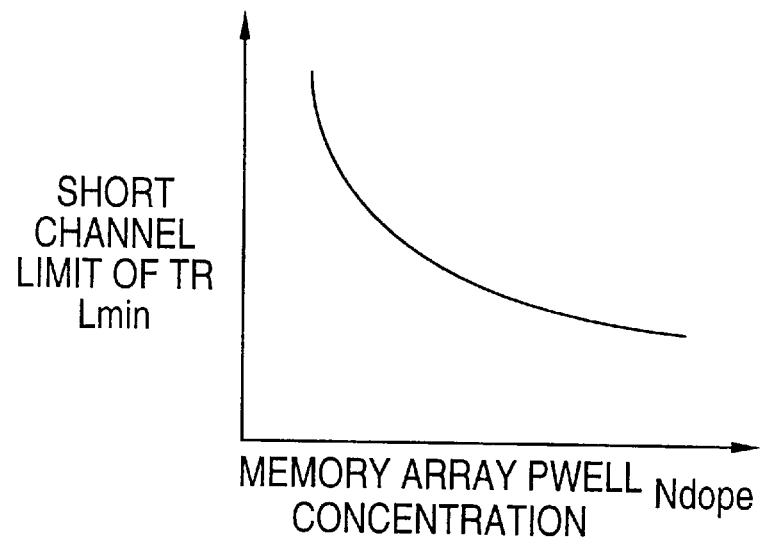
Figure 31:
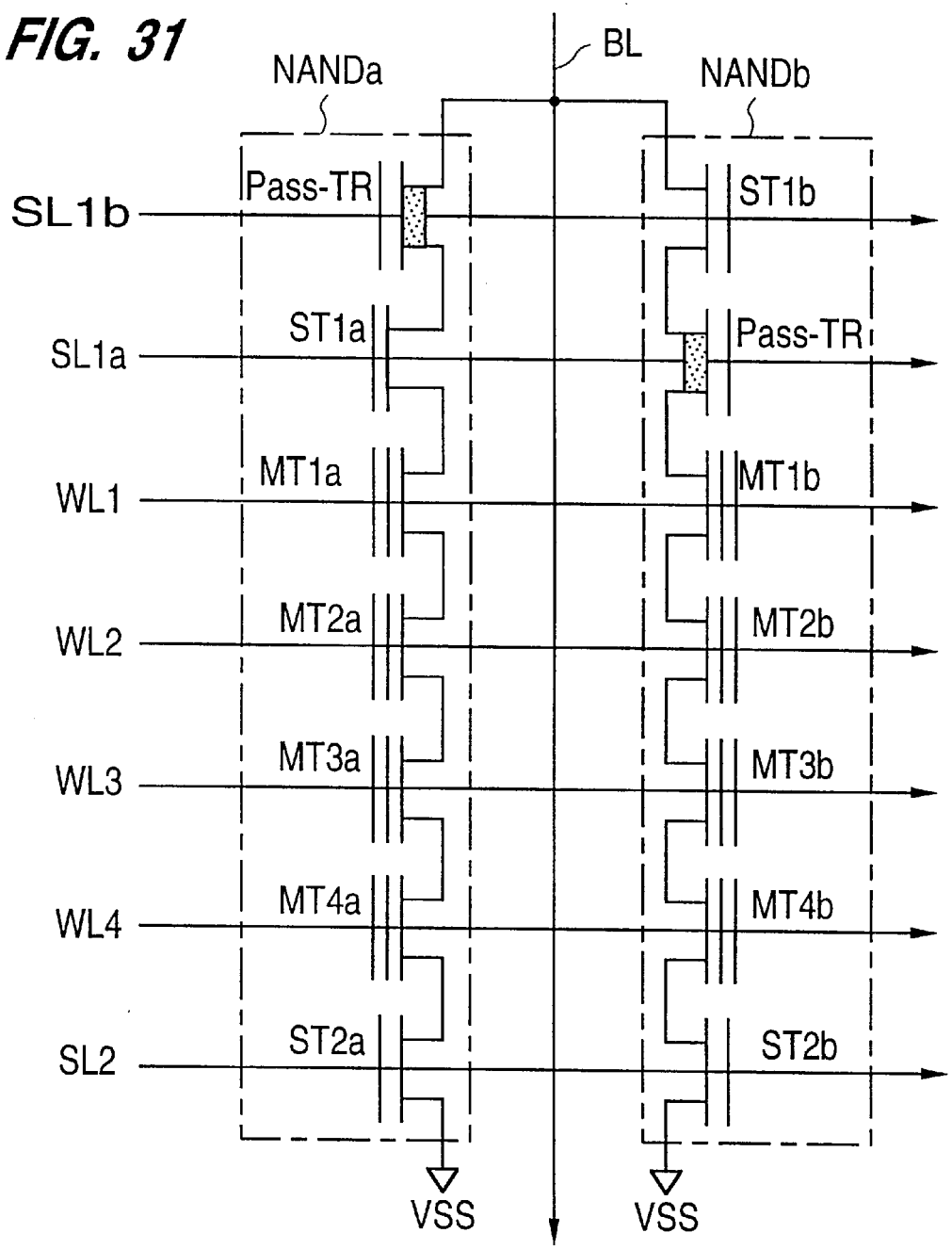
FIG. 31 is a view of a memory array of a NAND type flash memory of the related art capable of easing the pitch in the column direction.
Figure 32:
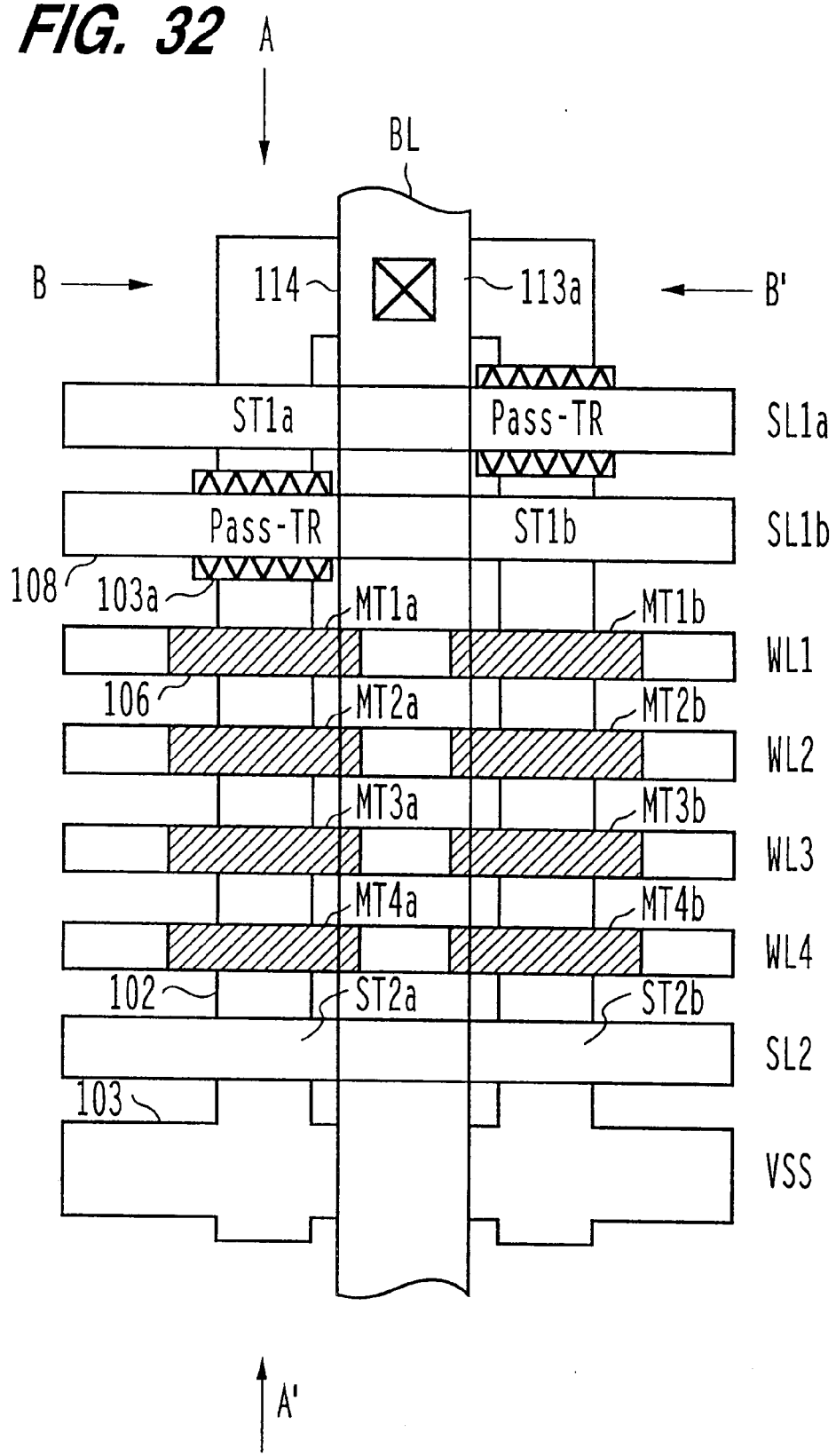
FIG. 32 is a view of the pattern layout of FIG. 31.

Further, FIGS. 27A and 27B are sectional views of the device structure, in which FIG. 27A is a sectional view in the direction A-A'; and FIG. 27B is a sectional view in the direction B-B'.

In FIG. 26 and FIGS. 27A and 27B, 100 denotes a semiconductor substrate, 101 denotes a P-type well region in which a memory array region is formed, 102 denotes a source and drain N-type diffusion layer of a memory transistor, 103 denotes a VSS interconnection and an N-type diffusion layer of a bit contact portion, 104 denotes a tunnel oxide film, 105 denotes a gate oxide film of the selection transistor portion, 105a denotes a LOCOS element isolation oxide film, 106 denotes a first layer polycrystalline silicon gate electrode forming a floating gate electrode, 107 denotes an ONO-3 layer insulation film, 108 denotes second layer polycrystalline silicon interconnections forming control gate electrodes of the memory transistors and selection transistors, 109 denotes an inter-layer insulation film under the third layer polycrystalline silicon interconnections, 110 denotes a contact hole under the third layer polycrystalline silicon interconnections, 111 denotes third layer polycrystalline silicon interconnections forming the sub bit lines, 112 denotes the inter-layer insulation film under the aluminum interconnections, 113 denotes a contact hole under the aluminum interconnections, and 114 denotes aluminum interconnections forming the main bit lines.

In the pattern layout of FIG. 26, the pitch of the bit contacts (110) between the third layer polycrystalline silicon interconnections (111) forming the sub bit lines and the sub bit lines in the column direction is not increased in comparison with the bit line pitch of the related art.

However, the detailed work in the process of formation of polycrystalline silicon interconnections and contacts is easier than the detailed work in the process of formation of aluminum interconnections and contacts, therefore it is more advantageous for the shrinking of the cell size than the bit line configuration of the related art.

As explained above, the NAND type semiconductor nonvolatile memory device of the fourth embodiment is configured as a memory array in which main bit lines are divided into a plurality of groups of sub bit lines in the column direction.

Accordingly, the pitch of the main bit lines in the column direction can be increased, therefore the layout of the bit contacts between the aluminum interconnections and the diffusion layer and the data latch circuits becomes easy.

Further, in comparison with the already explained fourth embodiment, the processing steps can be reduced.

As explained above, according to the present invention, a NAND type semiconductor nonvolatile memory device which is suited to operation by a single power supply at a low voltage, enables easy layout of the data latch circuit for every bit line, and in addition performs a data programming operation with a good data disturb tolerance can be realized.

Further, according to the present invention, a NAND type semiconductor nonvolatile memory device capable of increasing the pitch of the bit line layout in the column direction without substantially enlarging the memory cell size can be realized.

While the invention has been described by reference to specific embodiments chosen for purposes of illustration, it should be apparent that numerous modifications could be made thereto by those skilled in the art without departing from the basic concept and scope of the invention.

What is claimed is:

1. A semiconductor nonvolatile memory device, comprising:
   a plurality of main bit lines each divided into a plurality of sub bit lines via selective connecting means,
   a plurality of word lines,
   a plurality of memory transistors connected to the sub bit lines and arranged in a matrix, wherein control gate electrodes of these memory transistors are each connected to one of said word lines;
   a booster circuit for selectively setting said sub bit lines at a programming prohibit potential during a data programming operation; and
   a memory control circuit for causing a discharge in a selected sub bit line and placing all other non-selected sub bit lines in a floating state, during said data programming operation; wherein said memory control circuit then supplies a program voltage to a selected word line.

2. The semiconductor nonvolatile memory device according to claim 1, having a NAND string configuration in which a plurality of said memory transistors are connected in series along each of said sub bit lines, wherein a first selection transistor is connected in series between one of said sub bit lines and said series of memory transistors, and a second selection transistor is connected in series between said series of memory transistors and a precharging line.

3. The semiconductor nonvolatile memory device according to claim 1,
   wherein said memory transistors are grouped into NAND strings in each of which a plurality of said memory transistors are connected in series; and
   wherein said booster circuit only sets said selected sub bit line to said programming prohibit potential during a data programming operation, all other, nonselected sub bit lines are unaffected.

4. The semiconductor nonvolatile memory device according to claim 3, wherein:
   said main bit lines are individually connected to separate data latch circuits; and
   at the time of said data programming operation, page program data is transferred to said data latch circuits, and a potential of a NAND string channel portion in which a selected memory transistor exists and the programming prohibit potential charged in the sub bit line to which the NAND string containing the selected memory transistor is connected are discharged to a corresponding main bit line according to the latched data.

5. The semiconductor nonvolatile memory device according to claim 3, wherein:
   said sub bit lines are each connected to one of said main bit lines via a first connection transistor and connected to a precharging line, for charging the sub bit line to the programming prohibit potential, via a second connection transistor.

6. The semiconductor nonvolatile memory device according to claim 5 wherein:
   said first connection transistor and second connection transistor are connected at their respective gate electrodes to a first connection control line and a second connection control line, respectively.

7. The semiconductor nonvolatile memory device according to claim 6, wherein:
   floating gate electrodes of said memory transistors are formed by a first conductive layer film;
   said word lines to which the control gate electrodes of said memory transistors are connected, and said first connection control line and second connection control line are formed by a second conductive layer film;
   said sub bit lines and precharging line are formed by a third conductive layer film; and
   said main bit lines are formed by a fourth conductive layer film.

8. The semiconductor nonvolatile memory device according to claim 7, wherein:
   said first conductive layer film is a first polycrystalline silicon layer;
   said second conductive layer film is a second polycrystalline silicon layer or polycrystalline silicide layer;
   said third conductive layer film is a third polycrystalline silicon layer or a polycrystalline silicide layer; and
   said fourth conductive layer film is an aluminum layer.

9. A method of data programming of a NAND type semiconductor nonvolatile memory device wherein a plurality of main bit lines are each divided into a plurality of sub bit lines via operational connecting means, serial strings of memory transistors which are electrically programmed are connected in series between one of said sub bit lines and a ground line via selection transistors to constitute NAND strings, and the NAND strings are arranged in a matrix, the method comprising:
   selecting a sub bit line connected to a selected NAND string and boosting a potential of a channel portion of said selected NAND string to a programming prohibit potential using said selected sub bit line;
   discharging said selected sub bit line to the main bit line according to data to be programmed, while placing all non-selected sub bit lines in a floating state; and
   supplying a program voltage to said selected word line.

10. A nonvolatile memory device comprising:
    a plurality of main bit lines, wherein each main bit line is connected to a plurality of sub bit lines;
    a control connection transistor connected between each said sub bit line and a respective main bit line;
    a plurality of memory transistors arranged in groups, each such group of memory transistors comprising a plurality of memory transistors connected in series, and each such series of memory transistors beginning and ending with a selection transistor connected in series with said series of memory transistors, wherein each said sub bit line comprises a plurality of said groups of memory transistors;
    a plurality of word lines connected to gate electrodes of said memory transistors; and
    a plurality of selection lines connected to gate electrodes of said selection transistors.

11. The nonvolatile memory device of claim 10, further comprising a row decoder controlling said control connection transistors, said word lines and said selection lines.

12. The nonvolatile memory device of claim 11, further comprising a booster circuit providing a programming voltage and a programming prohibit voltage to said row decoder.

13. The nonvolatile memory device of claim 10, wherein each of said main bit lines is connected to a separate data latch circuit.

14. The nonvolatile memory device of claim 10, further comprising a precharging line, wherein each sub bit line is connected to said precharging line through a connection control transistor.

15. The nonvolatile memory device of claim 14, further comprising a booster circuit and a row decoder, wherein said booster circuit provides a programming voltage and a programming prohibit voltage to said row decoder and a precharging voltage to said precharging line, said row decoder controlling said word and selection lines.

16. The nonvolatile memory device of claim 10, wherein a group of memory and selection transistors on a first sub bit line and a group of memory and selection transistors on a second sub bit line are both connected to a single set of word and selection lines.

17. The nonvolatile memory device of claim 16, wherein said first and second sub bit lines are connected to a single main bit line.

18. The nonvolatile memory device of claim 16, wherein said first and second sub bit lines are connected to different main bit lines.

19. A method of programming a nonvolatile memory device comprising:

controlling connections between a main bit line and a plurality of sub bit lines with connection control transistors;

controlling connections between a plurality of groups of memory transistors and each of sad sub bit lines with a selection transistor, wherein each said group of memory transistors comprises a plurality of memory transistors connected in series, said series being connected to a said selection transistor;

controlling individual memory transistors with a plurality of word lines, each of which is connected to a gate electrode of one of said memory transistors; and controlling said selection transistors with a plurality of selection lines connected to gate electrodes of said selection transistors;

precharging said sub bit lines with a program prohibit voltage;

discharging only a selected sub bit line which placing all non-selected sub bit lines in a floating state;

providing a programming voltage on a word line connected to a selected memory transistor connected to said selected sub bit line.

* * * * *

UNITED STATES PATENT AND TRADEMARK OFFICE
CERTIFICATE OF CORRECTION

PATENT NO. : 5,969,990
DATED : October 19, 1999
INVENTOR(S) : Kenshiro ARASE

It is certified that error appears in the above-identified patent and that said Letters Patent is hereby corrected as shown below:

Column 32, Line 7,   Claim 19, Line 7, should read,
   memory transistors and each of said sub bit lines with a selection transistor...

Signed and Sealed this

Fifteenth Day of August, 2000

Attest:

Q. TODD DICKINSON

*Attesting Officer*   *Director of Patents and Trademarks*